(12) United States Patent
Lee et al.

(10) Patent No.: US 8,557,145 B2
(45) Date of Patent: Oct. 15, 2013

(54) CONDUCTIVE POLYMER COMPOUND AND ORGANIC PHOTOELECTRIC DEVICE INCLUDING SAME

(75) Inventors: Jeong-Woo Lee, Uiwang-si (KR);
Dal-Ho Huh, Uiwang-si (KR);
Mi-Young Chae, Uiwang-si (KR);
Tae-Woo Lee, Seoul (KR); Eui-Su Kang, Uiwang-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 564 days.

(21) Appl. No.: 12/801,263

(22) Filed: Jun. 1, 2010

(65) Prior Publication Data
US 2010/0237294 A1  Sep. 23, 2010

Related U.S. Application Data

(63) Continuation of application No. PCT/KR2008/007092, filed on Dec. 1, 2008.

(30) Foreign Application Priority Data

Nov. 30, 2007 (KR) .................. 10-2007-0123933

(51) Int. Cl.
*H01B 1/12* (2006.01)
*C08F 291/04* (2006.01)

(52) U.S. Cl.
USPC ........................................ 252/500

(58) Field of Classification Search
USPC .......................... 252/500; 428/960
See application file for complete search history.

(56) References Cited

U.S. PATENT DOCUMENTS 4,539,507 A   9/1985   Van Slyke et al.
4,720,432 A   1/1988   Van Slyke et al.

(Continued)

FOREIGN PATENT DOCUMENTS

CN  1821311 A   8/2006
CN  1880377 A   12/2006

(Continued)

OTHER PUBLICATIONS

European Search Report in EP 08853569.5-2109/2220135 PCT/KR2008007092, dated Feb. 25, 2011 (Lee, et al.).

*Primary Examiner* — Mark Kopec
(74) *Attorney, Agent, or Firm* — Lee & Morse, P.C.

(57) ABSTRACT

A conductive polymer compound includes: a conductive polymer; a first repeating unit represented by the following Chemical Formula 1; a second repeating unit represented by the following Chemical Formula 2; and a third repeating unit represented by the following Chemical Formula 3 and/or Chemical Formula 4,

[Chemical Formula 1]

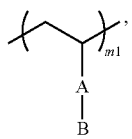

[Chemical Formula 2]

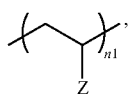

[Chemical Formula 3]

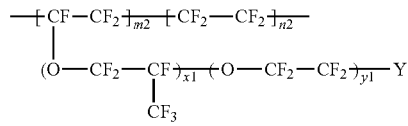

[Chemical Formula 4]

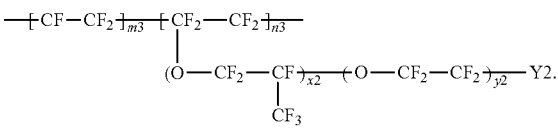

15 Claims, 7 Drawing Sheets

(56) References Cited

U.S. PATENT DOCUMENTS

| | | |
|---|---|---|
| 4,769,292 A | 9/1988 | Tang et al. |
| 7,371,336 B2 | 5/2008 | Hsu et al. |
| 7,462,298 B2 | 12/2008 | Hsu et al. |
| 7,875,208 B2 * | 1/2011 | Huh et al. ............... 252/500 |
| 2003/0010959 A1 | 1/2003 | Lee et al. |
| 2005/0202274 A1 | 9/2005 | Elschner et al. |
| 2006/0180810 A1 * | 8/2006 | Lee et al. ............... 257/40 |
| 2006/0261332 A1 | 11/2006 | Lee et al. |
| 2007/0176174 A1 | 8/2007 | Lee et al. |
| 2007/0187675 A1 | 8/2007 | Lee et al. |
| 2008/0105854 A1 | 5/2008 | Huh et al. |
| 2008/0234442 A1 | 9/2008 | Huh et al. |

FOREIGN PATENT DOCUMENTS

| | | |
|---|---|---|
| EP | 0 387 715 | 9/1990 |
| EP | 1564250 A1 | 8/2005 |
| KR | 10-2006-0091220 A | 8/2006 |
| KR | 10-2006-0120378 A | 11/2006 |
| KR | 10-2007-0048076 A | 5/2007 |
| KR | 10-2007-0078595 A | 8/2007 |
| KR | 10-2007-0081623 A | 8/2007 |
| KR | 10-0810682 B1 | 2/2008 |

* cited by examiner

CONDUCTIVE POLYMER COMPOUND AND ORGANIC PHOTOELECTRIC DEVICE INCLUDING SAME

CROSS-REFERENCE TO RELATED APPLICATION

This application is a continuation of pending International Application No. PCT/KR2008/007092, entitled "Conductive Polymer Compound and Organic Photoelectric Device Including Same," which was filed on Dec. 1, 2008, the entire contents of which are hereby incorporated by reference.

BACKGROUND

1. Field

Embodiments relate to a conductive polymer compound and an organic photoelectric device including the same.

2. Description of the Related Art

A photoelectric device is a device for transforming photo energy to electrical energy, and conversely, for transforming electrical energy to photo-energy. The photoelectric device may be exemplified by an organic light emitting diode, a solar cell, a transistor, and so on.

Particularly, among these photoelectric devices, the organic light emitting device employing organic light emitting diodes (OLED) has recently drawn attention due to the increase in demand for flat panel displays (FPD).

In the field of photoelectric devices including the organic light emitting diode, researchers are studying the formation of a conductive polymer layer in order to improve efficiency of a photoelectric device by smoothly transferring charges generated in an electrode, that is, holes and electrons, to the photoelectric device.

An organic light emitting diode is an active light emitting display device taking advantage of a phenomenon in which electrons and holes are combined in an organic layer while emitting light when an electrical current flows to a fluorescent or phosphorescent organic compound thin film (hereinafter referred to as an organic layer). The organic light emitting diode does not use a single light emission layer as the organic layer but employs a multi-layer structure including a hole injection layer (HIL) using a conductive polymer, a light emission layer, and an electron injection layer (EIL) to improve efficiency and decrease a driving voltage.

The multi-layer structure can be simplified by making one layer perform a plurality of functions. One of the simplest OLED structures is a structure where an organic layer performing all functions including the function of a light emission layer is interposed between two electrodes.

However, to substantially increase luminance, an electron injection layer (EIL) or a hole injection layer should be introduced to an electrical light emitting assembly.

The literature discloses many organic compounds capable of transferring charges (which are holes and electrons) to be used by an electron injection layer (EIL) or a hole injection layer (HIL). As examples, European Patent Publication No. 387 715, U.S. Pat. No. 4,539,507, U.S. Pat. No. 4,720,432, and U.S. Pat. No. 4,769,292 disclose organic compounds and their usages.

Particularly, Baytron-P, which is commercially available in the market by the Bayer AG Company, is a representative organic compound capable of transferring charges and is used for soluble organic electro-luminescence (EL). Baytron-P is a kind of PEDOT (poly(3,4-ethylene dioxythiophene))-PSS (poly(4-styrene sulfonate)) aqueous solution.

PEDOT-PSS is widely used for fabrication of an organic light emitting diode. It is used to form a hole injection layer (HIL) by spin-coating it on an indium tin oxide (ITO) electrode. The PEDOT-PSS has a structure as shown in the following Chemical Formula A.

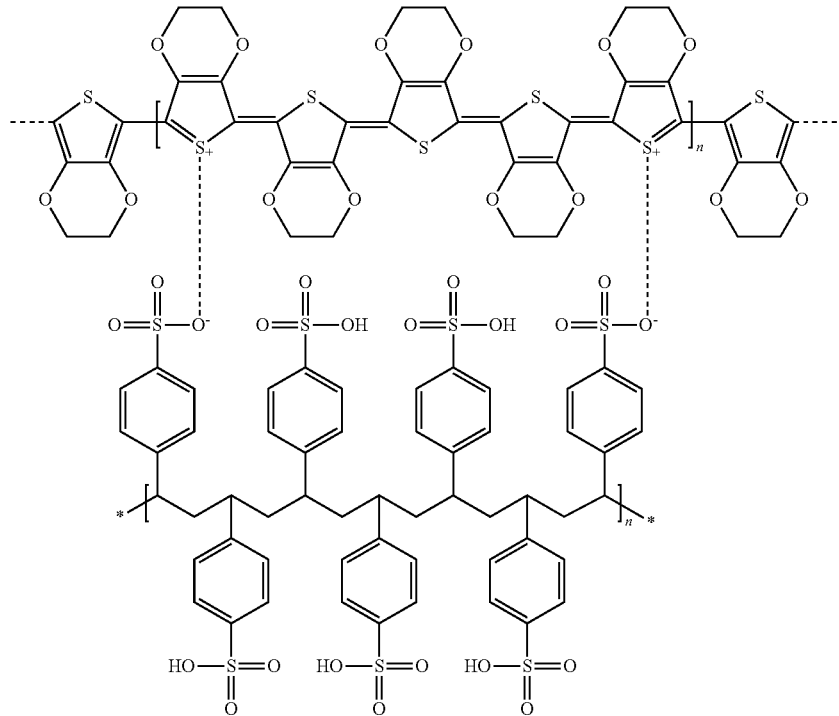

[Chemical Formula A]

The PEDOT-PSS expressed in the above Chemical Formula A is a simple ion composite of a polyacid, which is poly(4-styrene sulfonate) (PSS), and a conductive polymer, which is poly(3,4-ethylenedioxythiophene) (PEDOT). It has a structure in which PEDOT is doped with a water-soluble polyacid.

However, when the hole injection layer (HIL) is formed using the PEDOT-PSS conductive polymer composition, the PSS is deteriorated and dedoped due to its property of absorbing moisture, or a part of the PSS may be decomposed through a reaction with electrons to thereby emit a material such as a sulfate. The emitted material may be diffused into a neighboring organic layer, such as a light emission layer. The diffusion of a material originating from the hole injection layer (HIL) into the light emission layer causes exciton quenching to thereby decrease the efficiency and life-span of the organic light emitting diode.

To overcome the drawbacks, U.S. Patent Publication No. 2005/0251597 and Korean Patent Publication No. 2006-0120378 disclose using a conductive polymer doped with an ionomer where both main chains and branch chains have substituted fluorine groups.

[Chemical Formula B]

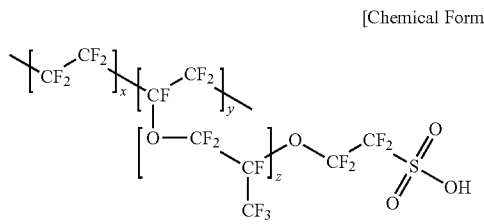

Such materials shown in the above Chemical Formula B have most of their carbon groups in the main chain and branch chain substituted with fluorine groups. Thus, the time that they are dispersed in water is short, and they form colloid-type particles. When a conductive polymer is prepared by using these materials, the particles agglomerate severely even with a minute increase in the length of the repeating unit of the conductive polymer. Also, when they are used for forming a thin film through a spin coating process, the generated thin film has poor uniformity.

SUMMARY

It is a feature of an embodiment to provide a conductive polymer compound having excellent thin film characteristics and storage stability, and being capable of improving luminous efficiency and life-span characteristics of an organic photoelectric device.

It is another feature of an embodiment to provide a conductive polymer compound composition including the conductive polymer compound.

It is another feature of an embodiment to provide a polymer organic layer fabricated using the conductive polymer compound.

It is another feature of an embodiment to provide an organic photoelectric device including the polymer organic layer, and thereby having excellent high efficiency and a long life-span.

At least one of the above and other features and advantages may be realized by providing a conductive polymer compound, including: a conductive polymer; a first repeating unit represented by the following Chemical Formula 1; a second repeating unit represented by the following Chemical Formula 2; and a third repeating unit represented by the following Chemical Formula 3 and/or Chemical Formula 4,

[Chemical Formula 1]

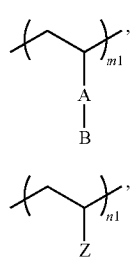

[Chemical Formula 2]

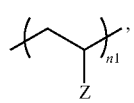

wherein, in the above Chemical Formulae 1 and 2:
$0.0001 \leq n1/m1 \leq 1$, m1 being the number of moles of Chemical Formula 1 and n1 being the number of moles of Chemical Formula 2, A is a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; or a substituted or unsubstituted heteroarylester, B is an ion pair of a cation and an anion, where:
the cation is:
$H^+$;
a metal ion, the metal ion being $Na^+$, $K^+$, $Li^+$, $Mg^{2+}$, $Zn^{2+}$, or $Al^{3+}$;
$NR_4^+$, where R is H or a substituted or unsubstituted alkyl; or
an organic ion of $CH_3(-CH_2-)pO^+$, where p ranges from 1 to 50; and
the anion is $PO_3^{2-}$, $SO_3^-$, $COO^-$, $I^-$, or $CH_3COO^-$, and Z is a halogen-containing substituted or unsubstituted hydrocarbon,

[Chemical Formula 3]

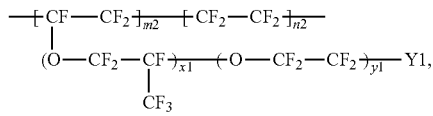

[Chemical Formula 4]

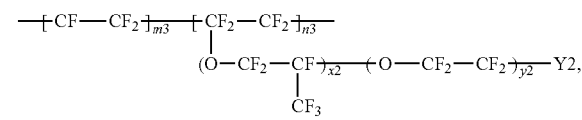

wherein, in the above Chemical Formulae 3 and 4:
$0<m2 \leq 10,000,000$, $0 \leq n2<10,000,000$,
$0<m3 \leq 10,000,000$, $0 \leq n3<10,000,000$,
x1, x2, y1, and y2 are independently integers ranging from 0 to 20, and
Y1 and Y2 are independently:
—$COO^-M^+$;
—$SO_3M^+$; or
—$PO_3^{2-}(M^+)_2$, where $M^+$ is $Na^+$, $K^+$, $Li^+$, $H^+$, or $NH_4^+$.

A my be a substituted or unsubstituted C1 to C30 alkyl; a substituted or unsubstituted C1 to C30 heteroalkyl; a substituted or unsubstituted C1 to C30 alkoxy; a substituted or unsubstituted C1 to C30 heteroalkoxy; a substituted or unsubstituted C6 to C30 aryl; a substituted or unsubstituted C6 to C30 arylalkyl; a substituted or unsubstituted C6 to C30 aryloxy; a substituted or unsubstituted C2 to C30 heteroaryl; a substituted or unsubstituted C2 to C30 heteroarylalkyl; a substituted or unsubstituted C2 to C30 heteroaryloxy; a substituted or unsubstituted C5 to C20 cycloalkyl; a substituted or unsubstituted C2 to C30 heterocycloalkyl; a substituted or unsubstituted C2 to C30 alkylester; a substituted or unsubstituted C1 to C30 heteroalkylester; a substituted or unsubstituted C7 to C30 arylester; or a substituted or unsubstituted C2 to C30 heteroarylester.

The conductive polymer may include: polyphenylene; polyphenylenevinylene; a repeating unit derived from aniline or derivatives thereof represented by the following Chemical Formula 5; a repeating unit derived from pyrrole, thiophene, or derivatives thereof represented by the following Chemical Formula 6; cyclic repeating unit represented by the following Chemical Formula 7; or a combination thereof,

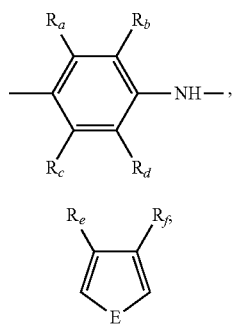

[Chemical Formula 5]

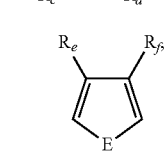

[Chemical Formula 6]

wherein, in the above Chemical Formulae 5 and 6:
E is:
NR, where R is H or a C1 to C7 lower alkyl; or
S,
$R_a$, $R_b$, $R_c$, and $R_d$ are independently hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted arylamine; a substituted or unsubstituted pyrrole; a substituted or unsubstituted C6 to C30 thiophene; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; or a substituted or unsubstituted heteroarylester, and
$R_e$ and $R_f$ are independently:
NR, where R is H or a C1 to C7 lower alkyl;
a C1 to C20 alkyl including a heteroatom, the heteroatom being N, O, S, or P;
a C6 to C20 aryl including a heteroatom, the heteroatom being N, O, S, or P;
an alkyl;
an aryl;
an alkoxy;
a C1 to C30 heteroalkyl;
a heteroalkoxy;
an arylalkyl;
an aryloxy;
a C6 to C30 arylamine;
a C6 to C30 pyrrole;
a C6 to C30 thiophene;
a heteroaryl;
a heteroarylalkyl;
a heteroaryloxy;
a C5 to C20 cycloalkyl;
a heterocycloalkyl;
an alkylester;
a heteroalkylester;
an arylester; or
a heteroarylester,

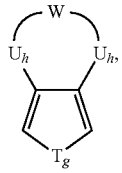

[Chemical Formula 7]

wherein, in the above Chemical Formula 7:
T is:
NR, where R is H or a C1 to C7 lower alkyl;
a heteroatom, the heteroatom being O or S; or
PR, where R is a C1 to C20 alkyl or a C6 to C20 aryl,
U is:
NR, where R is H or a C1 to C7 lower alkyl;
a heteroatom, the heteroatom being O or S; or
PR, where R is a C1 to C20 alkyl or a C6 to C20 aryl,
g and h are independently 0 to 9,
W is —$(CH_2)_x$—$CR_gR_h$—$(CH_2)_y$, where:
$R_g$ and $R_h$ are independently:
H;
a C1 to C20 alkyl radical;
a C6 to C14 aryl radical; or
—$CH_2$—$OR_i$, where $R_i$ is H, a C1 to C6 alkyl acid, a C1 to C6 alkylester, a C1 to C6 heteroalkyl acid, or a C1 to C6 alkylsulfonic acid, and
x and y are independently 0 to 5.

At least one of the above and other features and advantages may also be realized by providing a conductive polymer compound composition, including: a conductive polymer compound including a conductive polymer, a first repeating unit represented by the following Chemical Formula 1, a second repeating unit represented by the following Chemical Formula 2, and a third repeating unit represented by the following Chemical Formula 3 and/or Chemical Formula 4; and a solvent,

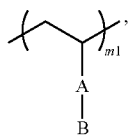

[Chemical Formula 1]

-continued

[Chemical Formula 2]

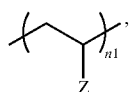

wherein, in the above Chemical Formulae 1 and 2:

$0.0001 \leq n1/m1 \leq 1$, m1 being the number of moles of Chemical Formula 1, and n1 being the number of moles of Chemical Formula 2;

A is a substituted or unsubstituted alkyl, a substituted or unsubstituted heteroalkyl, a substituted or unsubstituted alkoxy, a substituted or unsubstituted heteroalkoxy, a substituted or unsubstituted aryl, a substituted or unsubstituted arylalkyl, a substituted or unsubstituted aryloxy, a substituted or unsubstituted heteroaryl, a substituted or unsubstituted heteroarylalkyl, a substituted or unsubstituted heteroaryloxy, a substituted or unsubstituted cycloalkyl, a substituted or unsubstituted heterocycloalkyl, a substituted or unsubstituted alkylester, a substituted or unsubstituted heteroalkylester, a substituted or unsubstituted arylester, or a substituted or unsubstituted heteroarylester;

B is an ion pair of a cation and an anion, where:
the cation is:
$H^+$;
a metal ion, the metal ion being $Na^+$, $K^+$, $Li^+$, $Mg^{2+}$, $Zn^{2+}$, or $Al^{3+}$;
$NR_4^+$, where R is H or a substituted or unsubstituted alkyl; or
an organic ion of $CH_3(-CH_2-)_pO^+$, where p ranges from 1 to 50; and
the anion is: $PO_3^{2-}$, $SO_3^-$, $COO^-$, $I^-$, or $CH_3COO^-$, and Z is a halogen-containing substituted or unsubstituted hydrocarbon,

[Chemical Formula 3]

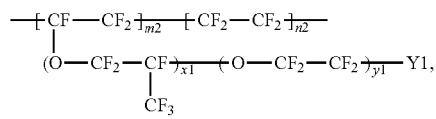

[Chemical Formula 4]

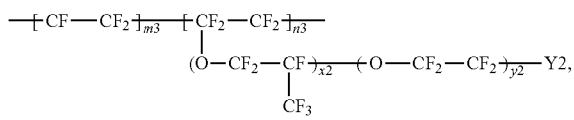

wherein, in the above Chemical Formulae 3 and 4:
$0 < m2 \leq 10{,}000{,}000$, $0 \leq n2 < 10{,}000{,}000$,
$0 < m3 \leq 10{,}000{,}000$, $0 \leq n3 < 10{,}000{,}000$,
x1, x2, y1, and y2 are independently integers ranging from 0 to 20, and
Y1 and Y2 are independently:
—$COO^-M^+$;
—$SO_3M^+$; or
—$PO_3^{2-}(M^+)_2$, where $M^+$ is $Na^+$, $K^+$, $Li^+$, $H^+$, or $NH_4^+$.

The conductive polymer may include: polyphenylene; polyphenylenevinylene; a repeating unit derived from aniline or derivatives thereof represented by the following Chemical Formula 5; a repeating unit derived from pyrrole, thiophene, or derivatives thereof represented by the following Chemical Formula 6; a cyclic repeating unit represented by the following Chemical Formula 7; or a combination thereof,

[Chemical Formula 5]

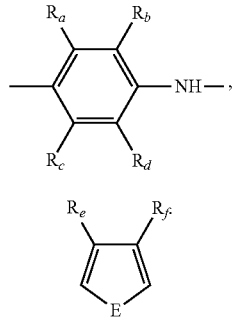

[Chemical Formula 6]

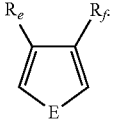

wherein, in the above Chemical Formulae 5 and 6:
E is:
NR, where R is H or a C1 to C7 lower alkyl; or
S,
$R_a$, $R_b$, $R_c$, and $R_d$ are independently hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted arylamine; a substituted or unsubstituted pyrrole; a substituted or unsubstituted C6 to C30 thiophene; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; or a substituted or unsubstituted heteroarylester, and $R_e$ and $R_f$ are independently:
NR, where R is H or a C1 to C7 lower alkyl;
a C1 to C20 alkyl including a heteroatom, the heteroatom being N, O, S, or P;
a C6 to C20 aryl including a heteroatom, the heteroatom being N, O, S, or P;
an alkyl;
an aryl;
an alkoxy;
a C1 to C30 heteroalkyl;
a heteroalkoxy;
an arylalkyl;
an aryloxy;
a C6 to C30 arylamine;
a C6 to C30 pyrrole;
a C6 to C30 thiophene;
a heteroaryl;
a heteroarylalkyl;
a heteroaryloxy;
a C5 to C20 cycloalkyl;
a heterocycloalkyl;
an alkylester;
a heteroalkylester;

an arylester; or
a heteroarylester,

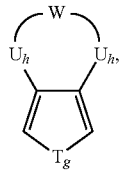
[Chemical Formula 7]

wherein, in the above Chemical Formula 7:
T is:
NR, where R is H or a C1 to C7 lower alkyl;
a heteroatom, the heteroatom being O or S; or
PR, where R is a C1 to C20 alkyl or a C6 to C20 aryl,
U is:
NR, where R is H or a C1 to C7 lower alkyl;
a heteroatom, the heteroatom being O or S; or
PR, where R is a C1 to C20 alkyl or a C6 to C20 aryl,
g and h are independently 0 to 9,
W is:
—$(CH_2)_x$—$CR_gR_h$—$(CH_2)y$, where Rg and Rh are independently:
H;
a C1 to C20 alkyl radical;
a C6 to C14 aryl radical; or
—$CH_2$—$OR_i$, where $R_i$ is H, a C1 to C6 alkyl acid, a C1 to C6 alkylester, a C1 to C6 heteroalkyl acid, or a C1 to C6 alkylsulfonic acid, and
x and y are independently 0 to 5.

The conductive polymer compound composition may further include: a physical cross-linking agent; a chemical cross-linking agent; or a combination thereof.

The conductive polymer compound composition may include the physical cross-linking agent in an amount of about 0.001 to about 5 parts by weight based on 100 parts by weight of the conductive polymer.

The physical cross-linking agent may include: glycerol; butanol; polyvinylalcohol; polyethyleneglycol; polyethyleneimine; polyvinylpyrrolidone; or a combination thereof.

The conductive polymer compound composition may include the chemical cross-linking agent in an amount of about 0.001 to about 50 parts by weight based on 100 parts by weight of the conductive polymer.

The chemical cross-linking agent may include: tetraethyloxysilane; polyaziridine; a melamine-based polymer; an epoxy-based polymer; or a combination thereof.

The solvent may include: water; alcohol; dimethyl formamide; dimethylsulfoxide; toluene; xylene; chlorobenzene; or a combination thereof.

At least one of the above and other features and advantages may also be realized by providing a conductive polymer organic layer, the conductive polymer organic layer being made using the conductive polymer composition according to an embodiment.

At least one of the above and other features and advantages may also be realized by providing an organic photoelectric device, including a conductive polymer organic layer made using the conductive polymer composition according to an embodiment.

The organic photoelectric device may be an organic light emitting diode.

The conductive polymer organic layer may be a hole injection layer or an electron injection layer.

BRIEF DESCRIPTION OF THE DRAWINGS

The above and other features and advantages will become more apparent to those of skill in the art by describing in detail example embodiments with reference to the attached drawings, in which.

DESCRIPTION OF REFERENCE NUMERALS INDICATING PRIMARY ELEMENTS IN THE DRAWINGS

Figure 1A:
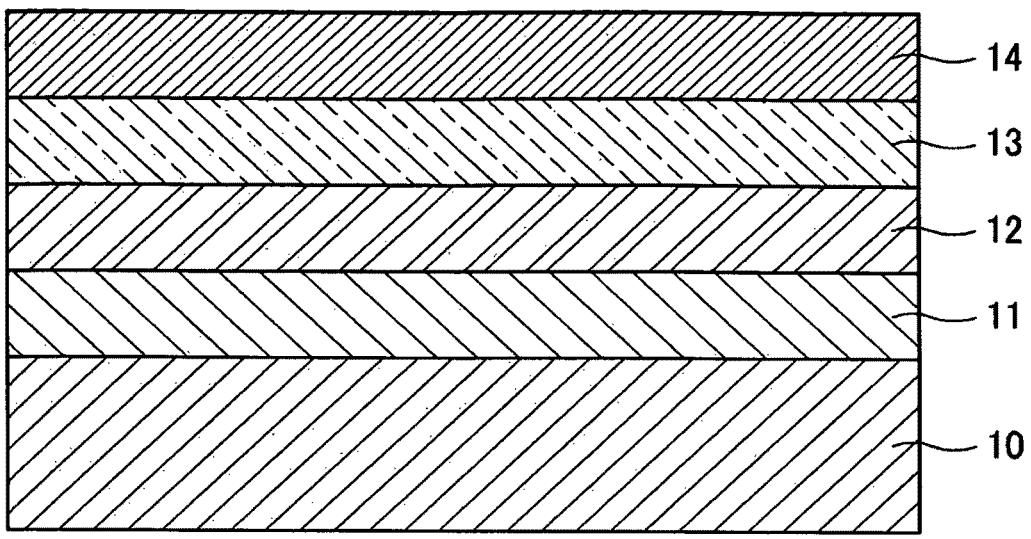
FIGS. 1A to 1D illustrate schematic cross-sectional views of organic light emitting diodes according to embodiments.

| | |
|---|---|
| 10: first electrode | 11: buffer layer |
| 12: light emission layer | 13: hole blocking layer |
| 14: second electrode | 15: electron transport layer (ETL) |
| 16: hole transport layer (HTL) | |

DETAILED DESCRIPTION

Korean Patent Application No. 10-2007-0123933, filed on Nov. 30, 2010, in the Korean Intellectual Property Office, and entitled: "Conductive Polymer Compound and Organic Photoelectric Device Including Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not provided, the term "alkyl" refers to a C1 to C30 alkyl, the term "heteroalkyl" refers to a C1 to C30 heteroalkyl, the term "alkoxy" refers to a C1 to C30 alkoxy, the term "heteroalkoxy" refers to a C1 to C30 heteroalkoxy, the term "aryl" refers to a C6 to C30 aryl, the term "arylalkyl" refers to a C6 to C30 arylalkyl, the term "aryloxy" refers to a C6 to C30 aryloxy, the term "a heteroaryl" refers to a C2 to C30 heteroaryl, the term "heteroarylalkyl" refers to a C2 to C30 heteroarylalkyl, the term "heteroaryloxy" refers to a C2 to C30 heteroaryloxy, the term "cycloalkyl" refers to a C5 to C20 cycloalkyl, the term "heterocycloalkyl" refers to a C2 to C30 heterocycloalkyl, the term "alkylester" refers to a C2 to C30 alkylester, the term "heteroalkylester" refers to a C1 to C30 heteroalkylester, the term "arylester" refers to a C7 to C30 arylester, and the term "heteroarylester" refers to a C6 to C30 heteroarylester.

As used herein, when specific definition is not provided, the term "substituted" refers to one substituted with at least a substituent including a halogen (F, Br, Cl, or I), a hydroxy, a nitro, a cyano, an amino (—$NH_2$, —NH(R), or —N(R')(R"), where R, R', and R" are independently a C1 to C10 alkyl), an amidino, a hydrazine, or a hydrazone, a carboxyl, a substituted or unsubstituted alkyl, a substituted or unsubstituted aryl, a substituted or unsubstituted cycloalkyl, a substituted or unsubstituted heteroaryl, or a substituted or unsubstituted heterocycloalkyl.

An alkyl may be a linear or branched alkyl such as methyl, ethyl, propyl, isobutyl, sec-butyl, tert-butyl, pentyl, iso-amyl, hexyl, and the like.

A heteroalkyl refers to an alkyl including at least one heteroatom, and preferably 1 to 5 heteroatoms such as oxygen (O), sulfur (S), nitrogen (N), phosphorus (P), and the like, in its main chain instead of carbon.

An alkoxy includes methoxy, ethoxy, propoxy, isobutyloxy, sec-butyloxy, pentyloxy, iso-amyloxy, hexyloxy, and the like.

An aryl refers to carbocycle aromatic molecules including at least one of aromatic cycles, and the cycles may be bound as a pendent group or fused. Examples of the aryl include aromatic groups such as phenyl, naphthyl, tetrahydronaphthyl, and the like.

An arylalkyl refers to an aryl including a lower alkyl, for example C1 to C5 radicals such as methyl, ethyl, propyl, and the like. Specific examples of the arylalkyl include benzylmethyl, phenylethyl, and the like.

An aryloxy refers to an —O-aryl radical, where the aryl is the same as described above. Examples of the aryloxy include phenoxy, naphthoxy, anthracenyloxy, phenanthrenyloxy, fluorenyloxy, indenyloxy, and the like, and at least one of hydrogen atoms of the aryloxy may be substituted with an alkyl.

A heteroaryl refers to C5 to C30 cyclic aromatic compounds including 1 to 3 hetero atoms selected from the group consisting of N, O, P, and S, with the remaining being carbon atom cycles. The cycles may be bound as a pendent group or fused.

A heteroarylalkyl refers to a heteroaryl including a lower alkyl, and the heteroaryl of the heteroarylalkyl is the same as above-described.

A heteroaryloxy refers to an —O-heteroaryl radical where the heteroaryl is the same as above-described.

A cycloalkyl refers to a C5 to C30 monovalent monocyclic system.

A heterocycloalkyl refers to a C5 to C30 monovalent monocyclic compound that is a cycloalkyl including 1 to 3 heteroatoms selected from N, O, P, or S.

A heteroalkoxy refers to a carbon compound where one side of —O— is connected to 1 to 3 heteroatoms selected from N, O, P, or S.

An alkylester refers to a —COO— alkyl radical where the alkyl is the same as above-described.

A heteroalkylester refers to a —COO— heteroalkyl radical where the heteroalkyl is the same as above-described.

An arylester and heteroarylester refer to —COO— aryl or heteroaryl radicals, and the aryl and heteroaryl are the same as above-described. Examples of the heteroarylester include moieties derived from oxadiazole, furan, pyrrole, pyrimidine, and the like.

According to a first embodiment, provided is a conductive polymer compound that includes: a conductive polymer; a first repeating unit of the following Chemical Formula 1; a second repeating unit of the following Chemical Formula 2; and a third repeating unit of the following Chemical Formula 3 and/or Chemical Formula 4.

The first and second repeating units exist in the form of a copolymer, and the third repeating unit exists in the form of a compound. The copolymer and the third repeating unit compound exist as a mixture, and the copolymer and the third repeating unit compound may be applied to dope the conductive polymer through ion coupling and function as a dopant, individually, or they may be present as a physical mixture with a conductive polymer. The copolymer may be a block copolymer with a repeating unit repeating regularly, or it may be a random copolymer with a repeating unit repeating randomly.

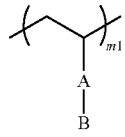

[Chemical Formula 1]

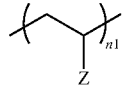

[Chemical Formula 2]

In the above Formulae 1 and 2, when the number of moles of Chemical Formula 1 is m1 and the number of moles of Chemical Formula 2 is n1, the ratio of m1 and n1 may be $0.0001 \leq n1/m1 \leq 1$.

In the above Formula 1, A may be: a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; or a substituted or unsubstituted heteroarylester.

In the above Formula 1, B may be ion-pair of a cation and an anion. The cation may be, e.g., a proton ($H^+$), a metal ion, $NR_4^+$, or an organic ion. The metal ion may be $Na^+$, $K^+$, $Li^+$, $Mg^{2+}$, $Zn^{2+}$, or $Al^{3+}$. In $NR_4^+$, R may be H or a substituted or unsubstituted alkyl. The organic ion may be $CH_3(-CH_2-)_pO^+$, where p ranges from 1 to 50. The anion may be $PO_3^{2-}$, $SO_3^-$, $COO^-$, $I^-$, or $CH_3COO^-$. The anion may be covalently bonded to A, above, e.g., by a terminal carbon of A, a ring carbon of A, etc.

In the above Formula 2, Z may be a halogen-containing substituted or unsubstituted hydrocarbon. The hydrocarbon may be a C2 to C30 hydrocarbon. The substituent may be nitrogen, phosphor, sulfur, silicon, or oxygen. The halogen may be fluorine, chlorine, bromine, iodine, or astatine. Preferably, the halogen is fluorine. The Z is a structure for applying a morphological change to the polymer copolymer by a dipole-dipole interaction or a hydrophobic group.

The Z may be a functional group of the following Chemical Formulae 8 to 12:

[Chemical Formula 8]

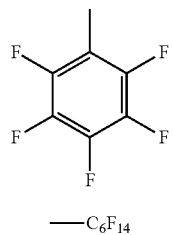

[Chemical Formula 9]

—C$_6$F$_{14}$

[Chemical Formula 10]

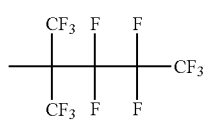

[Chemical Formula 11]

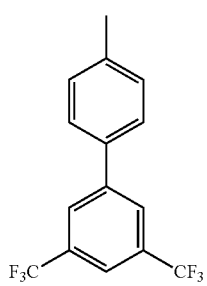

[Chemical Formula 12]

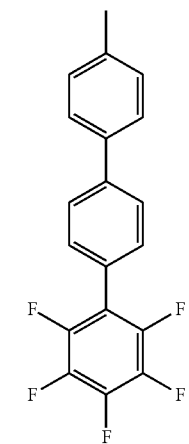

[Chemical Formula 3]

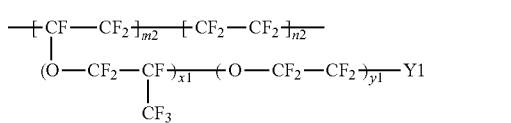

In the above Chemical Formula 3, m2 and n2 may be independently 0<m2≤10,000,000, 0≤n2<10,000,000.

[Chemical Formula 4]

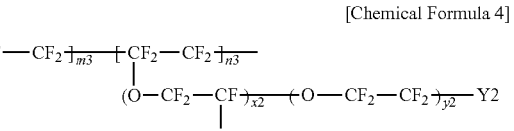

In the above Chemical Formula 4, m3 and n3 may be independently 0<m3≤10,000,000, 0≤n3<10,000,000.

In the above Chemical Formulae 3 and 4, x1, x2, y1, and y2 may be independently integers ranging from 0 to 20.

In the above Chemical Formulae 3 and 4, Y1 and Y2 may be independently —COO$^-$M$^+$, —SO$_3$M$^+$, or —PO$_3^{2-}$(M$^+$)$_2$, where M$^+$ is Na$^+$, K$^+$, Li$^+$, H$^+$, or NH$_4^+$.

The conductive polymer of the conductive polymer compound may be a generally used conductive polymer for an organic photoelectric device. The conductive polymer may include one or more of, e.g.: polyphenylene; polyphenylenevinylene; a repeating unit derived from aniline or derivatives thereof represented by the following Chemical Formula 5; a repeating unit derived from pyrrole, thiophene, or derivatives thereof represented by the following Chemical Formula 6; and/or a cyclic repeating unit represented by the following Chemical Formula 7.

[Chemical Formula 5]

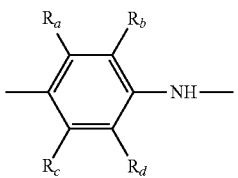

[Chemical Formula 6]

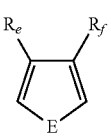

In the above Formula 6, E may be: NR, where R is H or a C1 to C7 lower alkyl; or S.

In the above Formula 5, R$_a$, R$_b$, R$_c$, and R$_d$ may be independently: hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted arylamine; a substituted or unsubstituted pyrrole; a substituted or unsubstituted C6 to C30 thiophene; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; or a substituted or unsubstituted heteroarylester.

In the above Formula 6, R$_e$ and R$_f$ may be independently: NR, where R is H or a C1 to C7 lower alkyl; a C1 to C20 alkyl including a heteroatom selected from N, O, S, and P; a C6 to C20 aryl including a heteroatom selected from N, O, S, and P; an alkyl; an aryl; an alkoxy; a C1 to C30 heteroalkyl; a heteroalkoxy; an arylalkyl; an aryloxy; a C6 to C30 arylamine; a C6 to C30 pyrrole; a C6 to C30 thiophene; a heteroaryl; a heteroarylalkyl; a heteroaryloxy; a C5 to C20 cycloalkyl; a heterocycloalkyl; an alkylester; a heteroalkylester; an arylester; or a heteroarylester.

[Chemical Formula 7]

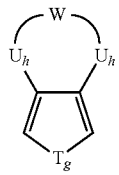

In the above Chemical Formula 7, T may be: NR, where R is H or a C1 to C7 lower alkyl; a heteroatom selected from O and S; or PR, where R is a C1 to C20 alkyl or a C6 to C20 aryl.

In the above Chemical Formula 7, U may be: NR where R is H or a C1 to C7 lower alky; a heteroatom selected from O and S; or PR where R is a C1 to C20 alkyl or a C6 to C20 aryl.

In the above Chemical Formula 7, g and h may be independently 0 to 9.

In the above Chemical Formula 7, W may be $-(CH_2)_x-CR_gR_h-(CH_2)y$. Rg and Rh may be independently H, a C1 to C20 alkyl radical, a C6 to C14 aryl radical, or $-CH_2-ORi$. Ri may be H, a C1 to C6 alkyl acid, a C1 to C6 alkylester, a C1 to C6 heteroalkyl acid, or a C1 to C6 alkylsulfonic acid.

In the above Chemical Formula 7, x and y may be independently 0 to 5.

For example, the states where the conductive polymers of the Chemical Formulae 5 to 7 are doped with the first repeating unit represented as the Chemical Formula 1, the second repeating unit represented as the Chemical Formula 2, and the third repeating unit represented as the Chemical Formula 3 and/or 4 are the states where the substituent B of Chemical Formula 1 and the substituents Y1 and Y2 of Chemical Formulae 3 and 4 are coupled with NH, E, and T of the Chemical Formulae 5 to 7.

The conductive polymer compound according to an embodiment, including the first repeating unit represented as Chemical Formula 1 and the second repeating unit represented as Chemical Formula 2, and the third repeating unit represented as the Chemical Formula 3 and/or Chemical Formula 4, and the conductive polymer, may provide excellent filtering performance and thin film uniformity, as the water-soluble repeating units of the Chemical Formulae 1 and 2 may inhibit the colloidal structures of the Chemical Formulae 3 and 4 to thereby drastically reduce an agglomeration phenomenon. Also, the conductive polymer compound according to an embodiment may exhibit excellent storage stability by reducing moisture absorption and acidity by using the first and second repeating units (which may be water-soluble polyacids with a substituted halogen structure in their branch chain), and the third repeating unit (which may be a polymer ionomer with fluoro groups substituted at more than 70 mol %). Also, an organic photoelectric device including the conductive polymer compound according to an embodiment may exhibit high efficiency and a long life-span.

The mixing ratio of the conductive polymer and the first to third repeating units may range from about 50:50 wt % to about 1:99 wt %, and more specifically from about 20:80 wt % to about 1:99 wt %. When the conductive polymer is included in the range of about 1 to about 50 wt %, the agglomeration phenomenon of the conductive polymer composition can be suppressed and thus no precipitation is generated in a solvent, which is desirable. In other words, the content of the conductive polymer should be at least 1 wt % to acquire conductivity applicable to an organic light emitting diode. When the content of the conductive polymer is less than 1 wt %, the conductivity is too low and the hole injection characteristic becomes drastically deteriorated. Therefore, appropriate dispersion and conductivity can be acquired when the content of the conductive polymer falls in the range of about 1 to about 50 wt %.

The above structures are merely examples presented to aid in understanding embodiments of the present invention, and the above structures do not limit the repeating units shown in Chemical Formulae 1 to 4 and or the conductive polymer of the present embodiment.

A second embodiment provides a conductive polymer compound composition including the conductive polymer compound and solvent.

Any solvent that is capable of dissolving the conductive polymer can be used as a solvent for preparing the conductive polymer compound composition according to an embodiment. The solvent may include, e.g., water, alcohol, dimethyl formamide (DMF), dimethylsulfoxide, toluene, xylene, and/or chlorobenzene.

In the conductive polymer compound composition according to an embodiment, the content of solid components, including a conductive polymer compound and/or a cross-linking agent, may range from about 0.5 to about 30 wt %, and more specifically from about 0.5 to about 10 wt %. When the content of the solid components falls in the range, the content of the solid component becomes appropriate and thus the concentration of the composition becomes appropriate as well. Since the concentration is appropriate, a thin film can be formed with a good shape, and this makes the process excellent.

Also, the conductive polymer compound composition of the present embodiment may further include a cross-linking agent to improve the cross-linking performance of the conductive polymer compound. The cross-linking agent may be a physical and/or chemical cross-linking agent.

The physical cross-linking agent used in the present embodiment is a material for physically cross-linking polymer chains without chemical coupling. The physical cross-linking agent refers to a low-molecular or polymer compound containing a hydroxyl group (—OH).

Examples of the physical cross-linking agent include low molecular compounds such as glycerol and butanol, and polymer compounds such as polyvinyl alcohol, polyethyleneglycol. Further, polyethyleneimine and polyvinylpyrrolidone can be used as the physical cross-linking agent.

The content of the added physical cross-linking agent may range from about 0.001 to about 5 parts by weight with respect to 100 parts by weight of the conductive polymer compound, and more specifically from about 0.1 to about 3 parts by weight.

When the content of the physical cross-linking agent falls in the range, the cross-linking agent performs efficiently, and the thin film morphology of the conductive polymer layer can be effectively maintained.

A chemical cross-linking agent is a material for chemically cross-linking polymer chains, and is a chemical material that is available for in-situ polymerization and is capable of forming an interpenetrating polymer network (IPN).

As for the chemical cross-linking agent, silane materials are often used, and for example, tetraethyloxysilane (TEOS) is used as a chemical cross-linking agent. Further, polyaziridine, melamine materials, and epoxy materials can be used as the chemical cross-linking agent.

The content of the chemical cross-linking agent may range from about 0.001 to about 50 parts by weight with respect to 100 parts by weight of a conductive polymer containing an organic ion salt, and more specifically from about 1 to about 10 parts by weight.

When the content of the chemical cross-linking agent falls in the range, the cross-linking agent performs effectively and does not affect the conductive polymer to thereby maintain sufficient conductivity.

When a mixture of the physical cross-linking agent and the chemical cross-linking agent is used, the mixture can be prepared properly within their content ranges described above.

The conductive polymer compound composition of the present embodiment may further include an organic ion salt.

The organic ion salt transfers electrons of the conductive polymer in a device to thereby improve current stability, life-span, and electrochemical stability. Examples of the organic ion salt include imidazolium salt, thiazolium salt, pyridinum salt, pyrrolidinum salt, and piperidinum salt.

The content of the organic ion salt may range from about 0.001 to about 10 parts by weight with respect to 100 parts by weight of a conductive polymer compound, and more specifically from about 0.01 to about 3 parts by weight.

When the content of the organic ion salt falls in the range of about 0.001 to about 10 parts by weight with respect to 100 parts by weight of a conductive polymer compound, there is an advantage in that the physical properties of the conductive polymer composition are not changed.

When the conductive polymer compound composition of the present embodiment is used for fabrication of an organic photoelectric device, it is coated on a substrate. Herein, most of its solvent is removed and the conductive polymer compound composition remains as a conductive polymer organic layer. In this way, a third embodiment provides a polymer organic layer formed by using the conductive polymer compound composition.

A fourth embodiment provides an organic photoelectric device including a conductive polymer organic layer formed by using a conductive polymer compound composition. The photoelectric device may be exemplified by organic light emitting diodes, organic solar cells, organic transistors, organic memory device, and the like.

Hereafter, the way in which a conductive polymer composition according to an embodiment is applied to an organic light emitting diode will be described.

In an organic light emitting diode, the conductive polymer composition is used in a charge injection layer, that is, a hole or electron injection layer (EIL). The light emitting intensity and the efficiency of the organic light emitting diode are increased by uniformly and efficiently injecting holes and electrons.

Also, in case of an organic solar cell, the conductive polymer layer composition of the present embodiment may be used as an electrode or an electrode buffer layer to thereby increase quantum efficiency. In case of an organic transistor, it can be used as an electrode material in a gate and/or source-drain electrode.

Among the organic photoelectric devices described above, a structure of an organic light emitting diode using the conductive polymer layer composition according to an embodiment and a fabrication method thereof will be described hereafter.

FIGS. 1A to 1D illustrate schematic cross-sectional views of organic light emitting diodes according to embodiments.

The organic light emitting diode of FIG. 1A may include a light emission layer 12 formed above a first electrode 10, a hole injection layer (HIL) 11 including the conductive polymer composition of an embodiment disposed between the first electrode 10 and the light emission layer, a hole blocking layer (HBL) 13 on top of the light emission layer 12, and a second electrode 14 on top of the hole blocking layer (HBL) 13. The hole injection layer (HIL) 11 may be referred to as a buffer layer.

Figure 1B:
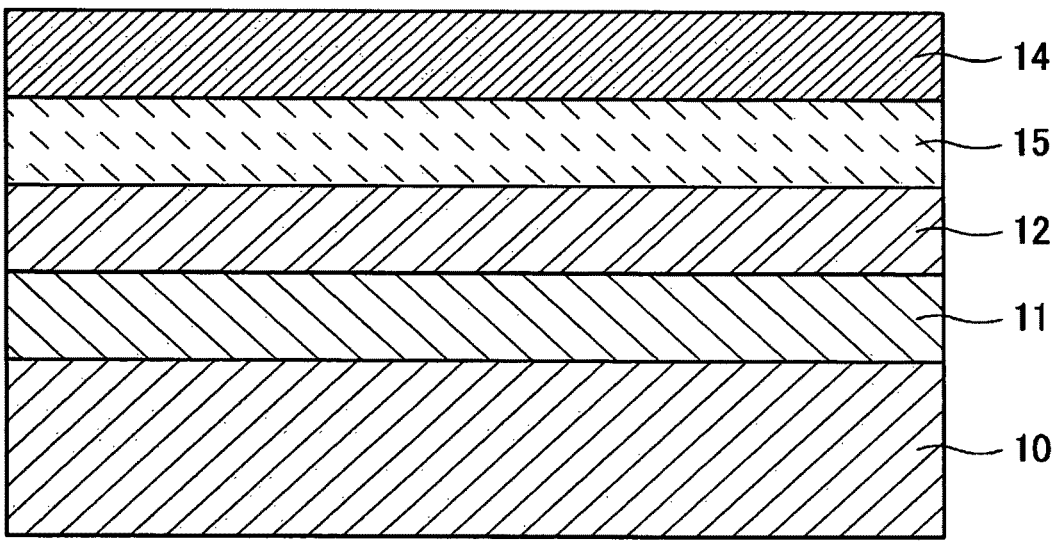

The organic light emitting diode of FIG. 1B has the same stacking structure as that of FIG. 1A, except that an electron transport layer (ETL) 15 is formed instead of the hole blocking layer (HBL) 13 on top of the light emission layer 12.

Figure 1C:
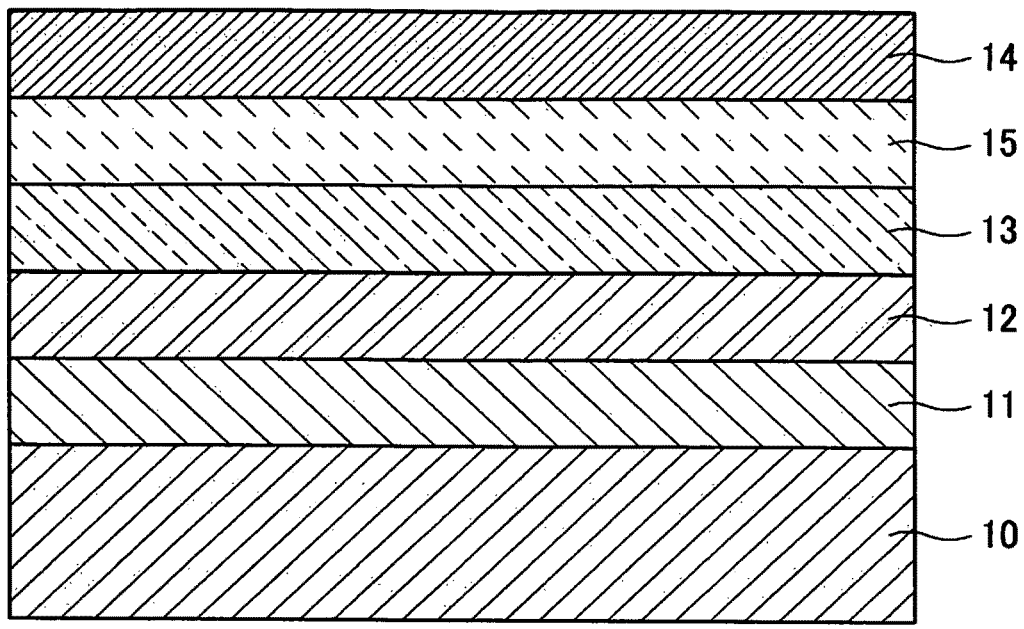

The organic light emitting diode of FIG. 1C has the same stacking structure as that of FIG. 1A, except that a dual layer of the hole blocking layer (HBL) 13 and the electron transport layer ETL 15 sequentially stacked therein is formed on top of the light emission layer 12.

Figure 1D:
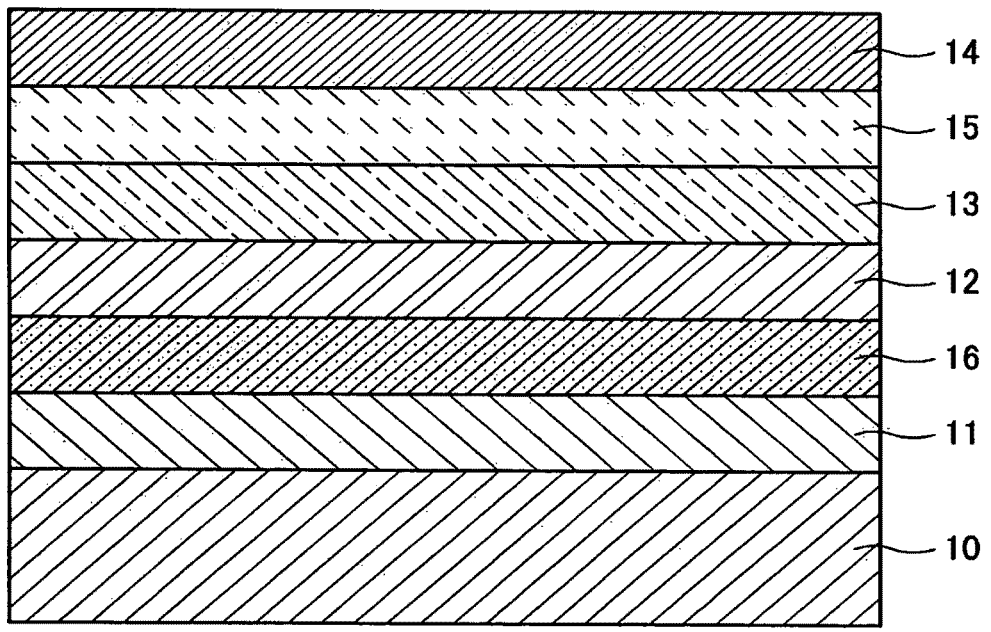

The organic light emitting diode of FIG. 1D has the same structure as that of FIG. 1C, except that a hole transport layer (HTL) 16 is formed between the hole injection layer (HIL) 11 and the light emission layer 12. Herein, the hole transport layer (HTL) 16 suppresses permeation of impurities from the hole injection layer (HIL) 11 to the emission layer 12.

The organic light emitting diode having the stacking structure of FIGS. 1A to 1D can be fabricated through a general fabrication method.

First, a patterned first electrode 10 is formed on a substrate (not shown). The substrate is a generally-used substrate for an organic light emitting diode, and may be a glass substrate or a transparent plastic substrate having excellent general transparence, surface smoothness, handling ease, and water repellency. The substrate has a thickness of 0.3 to 1.1 mm.

Materials for forming the first electrode 10 are not specifically limited. When the first electrode is a cathode, the cathode is formed using conductive metals or oxides thereof that easily performs hole injection. Examples of the materials include indium tin oxide (ITO), indium zinc oxide (IZO), nickel (Ni), platinum (Pt), gold (Au), iridium (Ir), and so on.

The substrate including the first electrode 10 is cleaned and is subjected to UV ozone treatment. An organic solvent such as isopropanol (IPA), acetone, and the like may be used for the cleaning process.

The hole injection layer (HIL) 11, which is a buffer layer including the conductive polymer compound composition according to an embodiment, is formed on the first electrode 10 of the cleaned substrate. The formation of the hole injection layer (HIL) 11 reduces contact resistance between the first electrode 10 and the light emission layer 12, and at the same time improves hole transfer capability of the first electrode 10 toward the light emission layer 12. Thus, the driving voltage and life-span characteristics of the device can be generally improved.

The hole injection layer HIL 11 is formed by dissolving the conductive polymer compound according to an embodiment, and optionally a cross-linking agent and/or organic ion salt, in a solvent to thereby prepare a composition for forming a hole injection layer (HIL), coating the upper part of the first electrode 10 with the prepared composition for forming a hole injection layer (HIL) through a spin-coating process, and drying the composition.

Herein, the thickness of the hole injection layer (HIL) 11 may be, e.g., 5 to 200 nm, and more specifically 20 to 100 nm. When the thickness of the hole injection layer (HIL) 11 falls in the range, the hole injection can be sufficiently performed, and the light transmission can be maintained at a good level.

A light emission layer 12 is disposed on the hole injection layer (HIL) 11. The light emission layer material is not specifically limited. Specific examples of the material include an oxadiazole dimer dye (Bis-DAPDXP)), spiro compounds (Spiro-DPVBi, Spiro-6P), triarylamine compounds, bis (styryl)amine (DPVBi, DSA), Flrpic, CzTT, anthracene, TPB, PPCP, DST, TPA, OXD-4, BBOT, and AZM-Zn (blueemitting); coumarin 6, C545T, quinacridone, and Ir(ppy)$_3$ (green-emitting); DCM1, DCM2, Eu(thenoyltrifluoroacetone)3 (Eu(TTA)$_3$ and 1,1,7,7-tetramethyljulolidyl-9-enyl)-4H-pyran: DCJTB) (red-emitting), and the like.

In addition, polymer light emitting materials may be used. The polymer light emitting materials include polymers such as phenylene-based, phenylene vinylene-based, thiophene-based, fluorine-based, and spiro-fluorene-based polymers or nitrogen-included aromatic compounds, but are not limited thereto.

The thickness of the emission layer 12 may be, e.g., 10 to 500 nm, and more specifically 50 to 120 nm. When the thickness of the emission layer 12 falls in the range, leakage current amount and driving voltage increase can be appropriately maintained and this effectively increases the life-span.

A dopant may be added to the composition for forming the light emission layer.

The content of the dopant varies according to the material used for forming the light emission layer, but generally the content of the dopant may range from about 30 to about 80 parts by weight with respect to 100 parts by weight of the material for forming a light emission layer (total weight of host and dopant).

When the content of the dopant falls in the range, the light emitting characteristics of the EL device can be effectively maintained. Examples of the dopant include an arylamine, peryl-based compounds, pyrrole-based compounds, hydrazone-based compounds, carbazole-based compounds, stilbene-based compounds, starburst-based compounds, and oxadiazole-based compounds.

A hole transport layer (HTL) 16 may be selectively formed between the hole injection layer (HIL) 11 and the emission layer 12.

A material for forming the hole transport layer (HTL) is not specifically limited. However, it may include at least one selected from compounds including a carbazole and/or an arylamine, which transport holes, phthalocyanine-based compounds, and triphenylene derivatives.

More specifically, the hole transport layer (HTL) material may include at least one material selected from 1,3,5-tricarbazolylbenzene,
4,4'-biscarbazolylbiphenyl, polyvinylcarbazole, m-biscarbazolylphenyl,
4,4'-biscarbazolyl-2,2'-dimethylbiphenyl, 4,4',4"-tri(N-carbazolyl)triphenylamine,
1,3,5-tri(2-carbazolylphenyl)benzene,
1,3,5-tris(2-carbazolyl-5-methoxyphenyl)benzene, bis(4-carbazolylphenyl)silane,
N,N'-bis(3-methylphenyl)-N,N'-diphenyl-[1,1-biphenyl]-4,4'diamine (TPD),
N,N'-di(naphthalen-1-yl)-N,N'-diphenyl benzidine (α-NPD),
N,N'-diphenyl-N,N'-bis(1-naphthyl)-(1,1'-biphenyl)-4,4'-diamine (NPB), IDE320 (Idemitsu Kosan Co., Ltd.)
poly(9,9-dioctylfluorene-co-N-(4-butylphenyl)diphenylamine) (TFB), and
poly(9,9-dioctylfluorene-co-bis-N,N-phenyl-1,4-phenylenediamine) (PFB), but is not limited thereto.

The hole transport layer (HTL) 16 may have a thickness of, e.g., 1 to 100 nm, and more specifically 5 to 50 nm. When the thickness of the hole transport layer (HTL) 16 falls in the range, the hole transport layer (HTL) 16 can maintain sufficient hole transport capability and an appropriate level of driving voltage.

A hole blocking layer 13 and/or an electron transport layer (ETL) 15 may be disposed on the light emission layer 12 through a deposition or spin coating method. The hole blocking layer 13 prevents excitons formed in a light emitting material from transferring to the electron transport layer (ETL) 15, or it prevents holes from transferring to the electron transport layer (ETL) 15.

Examples of a material for forming the hole blocking layer 13 include phenanthroline-based compounds (e.g., BCP of the UDC Company) represented as Chemical Formula 13, imidazole-based compounds represented as Chemical Formula 14, triazole-based compounds represented as Chemical Formula 15, oxadiazole-based compounds (e.g., a commercial product PBD) represented as Chemical Formula 16, and an aluminum complex (e.g., BAlq of the UDC Company) represented as Chemical Formula 17.

The thickness of the hole blocking layer may be, e.g., 5 to 100 nm, and the thickness of the electron transport layer (ETL) may be, e.g., 5 nm to 100 nm. When the thicknesses fall in the above ranges, the electron transport capability and the hole suppression capability can be effectively maintained.

[Chemical Formula 13]

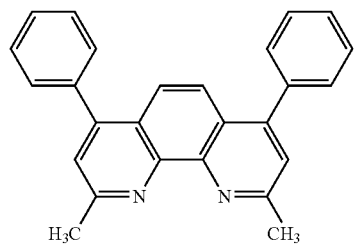

[Chemical Formula 14]

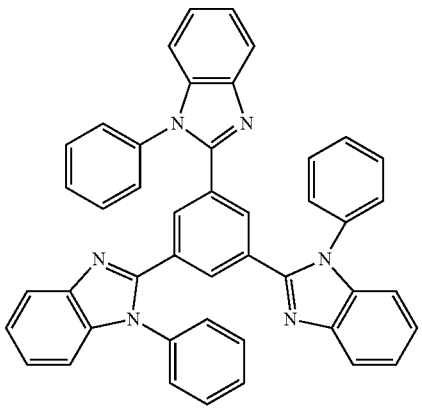

[Chemical Formula 15]

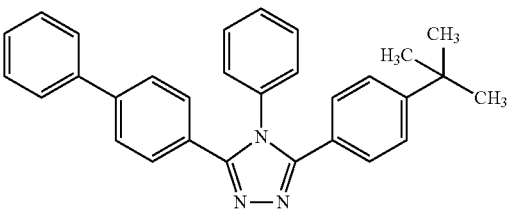

[Chemical Formula 16]

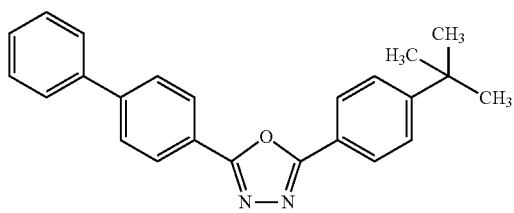

[Chemical Formula 17]

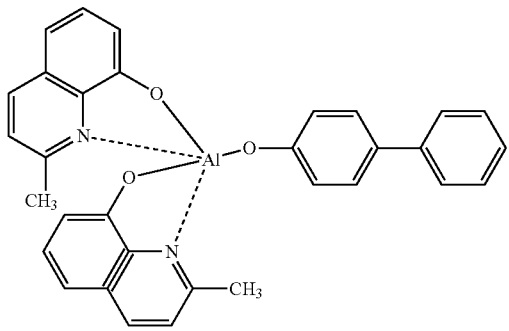

The electron transport layer ETL 15 may include a material selected from oxazole-based compounds, isooxazole-based compounds, triazole-based compounds, isothiazole-based compounds, oxadiazole-based compounds, thiadiazole-based compounds, perylene-based compounds of Chemical Formula 18, aluminum complexes (Alq3 (tris(8-quinolino-lato)-aluminum)) of Chemical Formula 19, BAlq of Chemical Formula 20, SAlq of Chemical Formula 21, Almq3 of Chemical Formula 22, gallium complexes (Gaq'2OPiv) of Chemical Formula 23, Gaq'2OAc of Chemical Formula 24, 2(Gaq'2) of Chemical Formula 25, and the like.

[Chemical Formula 18]

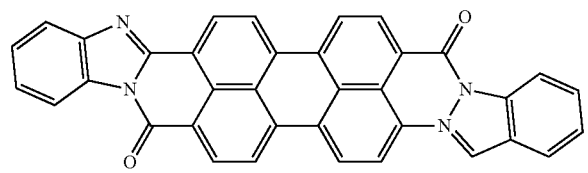

[Chemical Formula 19]

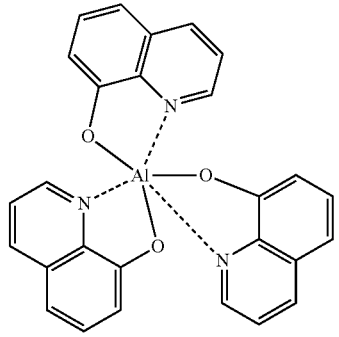

[Chemical Formula 20]

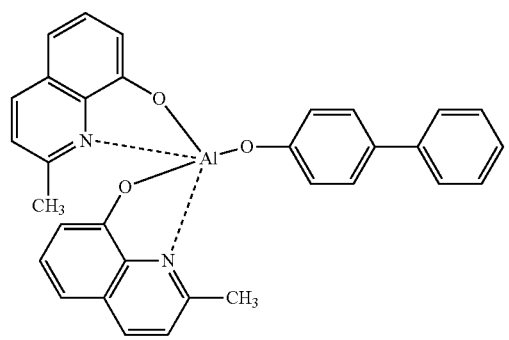

[Chemical Formula 21]

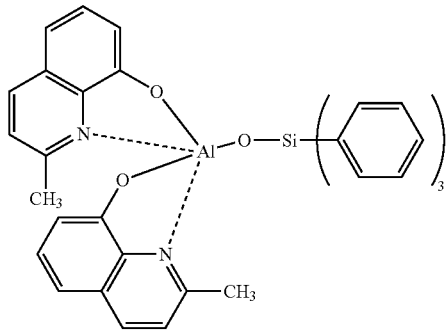

[Chemical Formula 22]

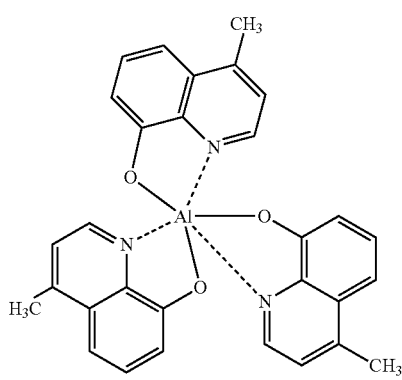

[Chemical Formula 23]

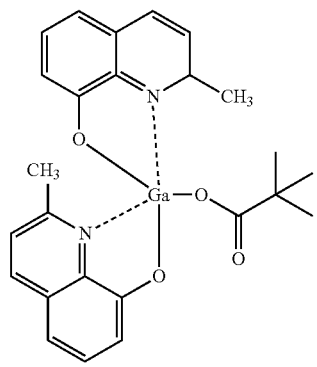

[Chemical Formula 24]

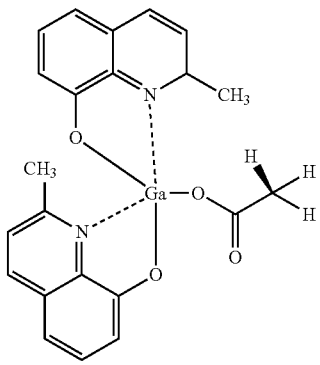

-continued

[Chemical Formula 25]

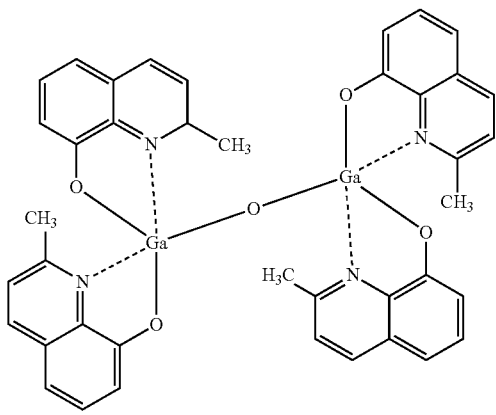

The second electrode 14 is disposed on the stacking structure fabricated as above, and the resulting material is sealed to thereby complete the fabrication of an organic light emitting diode.

The materials for forming the second electrode 14 are not specifically restricted, but the materials may be metals with a small work function, such as Li, Cs, Ba, Ca, Ca/Al, LiF/Ca, LiF/Al, $BaF_2$/Ca, Mg, Ag, Al, or alloys thereof, or multilayers thereof. The thickness of the second electrode 14 may be, e.g., 50 to 3000 Å.

The fabrication of an organic light emitting diode according to the present embodiment does not require a specific apparatus or method, and the organic light emitting diode of the present embodiment may be fabricated through an organic light emitting diode fabrication method using a typical conductive polymer composition.

Hereinafter, in the following examples and comparative examples, a conductive polymer for an organic photoelectric device according to embodiments can suppress moisture absorption, and reduce polyacid concentration in a molecule and intermolecular agglomeration resulting in improvement of thin film characteristics and storage stability and efficiency and life-span characteristics of an organic photoelectric device. A person having ordinary skills in this art can sufficiently understand parts of the present embodiment that are not specifically described.

Example 1

Synthesis of Water-Soluble Copolymer 48 grams of sodium styrene sulfonate (SSNa) produced by the Sigma Aldrich Company and 19 grams of pentafluorostyrene (PFS) were completely dissolved in 0.6 liter of dimethylsulfoxide (DMSO) while being heated.

1 gram of azobisisobutyronitrile (AIBN) was dissolved in dimethylsulfoxide (DMSO) and added in a dropwise fashion for polymerization for more than 24 hours. Through precipitation and filtration, a {P(SSNa-co-PFS)} copolymer with 30 mol % PFS was prepared.

In the same method, {P(SSNa-co-PFS)} copolymers with 5, 10, and 20 mol % pentafluorostyrene (PFS) were prepared by varying and reacting 5, 10, and 20 mol % PFS.

A poly(styrenesulfonic acid-perfluorostyrene) copolymer {P(SSA-co-PFS)} aqueous solution represented as the following Chemical Formula 26 was prepared by reacting the above copolymers with a cation-based resin (Amberite™ R-120) and an anion-based resin (Lewatit™ MP62). The prepared copolymer was water-soluble, and the total solid content of the aqueous solution was 1.5 wt %. In the following Chemical formula 26, n1/m1 is 0.25.

[Chemical Formula 26]

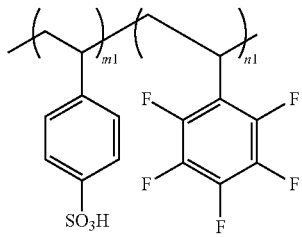

Example 2

Preparation of PEDOT Conductive Polymer Compound Composition

An ionomer where the structure of the following Chemical formula 27 (which is NAFION) exists as a colloid in a 5 wt % mixed solvent of water and 2-propanol at a volume ratio of 45:55 was purchased from the Sigma Aldrich Company.

The copolymer of Chemical Formula 26 prepared in Example 1 and containing 20 mol % of PFS was mixed with the ionomer of Chemical formula 27 at weight ratios of 50:50, 80:20, and 90:10. Then, a mixed solvent of water and alcohol at 50:50 was added to the mixture in such a manner that the entire solids occupied 1.5 wt %. The mixture solution was sufficiently agitated for more than 1 hour.

3,4-ethylenedioxythiophene (EDOT) was added to the mixture solution and polymerized using an ammoniumpersulfate oxidizing agent under the conditions of Table 1. Salts generated as products or byproducts of the reaction were purified through an ion exchange resin method or a dialysis method. A solution including the conductive polymer compound acquired as above was used as a conductive polymer compound composition. The solution included a solvent of water and 2-propanol at a volume ratio of 45:55. The content ratio of the polymer compound, i.e., the solid content ratio, was in the range of 1.5 to 1.7 wt %. The conductive polymer compound composition was used for fabrication of an organic light emitting diode.

[Chemical Formula 27]

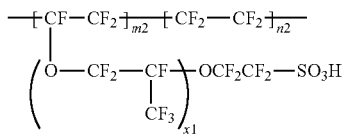

wherein m2=1, n2=5-11, and x1=1.

TABLE 1

| Sample | Compound of Chemical Formula 26 (wt %) | NAFION (wt %) | EDOT (wt %) | Reaction time (hrs) | Filtering capability |
|---|---|---|---|---|---|
| S-1 | 44.5 | 44.5 | 11 | 12 | 0 |
| S-2 | 43 | 43 | 14 | 12 | 0 |

TABLE 1-continued

| Sample | Compound of Chemical Formula 26 (wt %) | NAFION (wt %) | EDOT (wt %) | Reaction time (hrs) | Filtering capability |
|---|---|---|---|---|---|
| S-3 | 40 | 40 | 20 | 12 | X |
| S-4 | 71.2 | 17.8 | 11 | 12 | 0 |
| S-5 | 68.8 | 17.2 | 14 | 12 | 0 |
| S-6 | 64 | 16 | 20 | 12 | 0 |
| S-7 | 80.1 | 8.9 | 11 | 12 | 0 |
| S-8 | 77.4 | 8.6 | 14 | 12 | 0 |
| S-9 | 72 | 8 | 20 | 12 | 0 |

Comparative Example 1

Preparation of NAFION/PEDOT Composition

A NAFION/PEDOT conductive polymer composition was prepared by using an ionomer of a colloid structure according to U.S. patent application Ser. No. 10/803,113, which is hereby incorporated by reference in its entirety and for all purposes.

Comparative Example 2

Preparation of PEDOT/PSS and NAFION Blended Composition

In accordance with Korean Patent Publication No. 2006-0091220, a conductive polymer composition solution was prepared by simply mixing Baytron-P, which is a commercial product name of PEDOT, with the NAFION ionomer shown in Chemical formula 27 at weight ratios of 1:1, 2:1, and 4:1.

Comparison of Filtering Capability

Filtering capability of the compositions acquired from Example 2 and Comparative Examples 1 and 2 was measured by using a 0.45 μm syringe filter formed of a polyvinylidene fluoride material. The results are as shown in the following Table 2.

TABLE 2

| Sample | Copolymer | Compound of Chemical Formula 26 (wt %) | Baytron-P | NAFION (wt %) | EDOT (wt %) | Filtering capability[a] |
|---|---|---|---|---|---|---|
| S-2 | Ex. 2 | 43 | — | 43 | 14 | ○ |
| S-3 | Ex. 2 | 40 | — | 40 | 20 | X |
| ref-1 | Comp. Ex. 1 | — | — | 86 | 14 | X |
| ref-2 | Comp. Ex. 1 | — | — | 89 | 11 | X |
| ref-3 | Comp. Ex. 2 | — | 50 | 50 | — | □ |
| ref-4 | Comp. Ex. 2 | — | 67 | 33 | — | ○ |
| ref-5 | Comp. Ex. 2 | — | 80 | 20 | — | ○ |

Note)
filtering capability: ○ (filterable over 3 ml), □ (filterable 2 to 3 ml), X (filterable only less than 2 ml)

Filtering capability was not remarkably decreased except for sample S-3 among the samples S-1 to S-9 shown in Table 1 of Example 2. However, Table 2 shows that ref-1 and ref-2 prepared as reference samples in Comparative Example 1 had poor filtering capability. This is because the ionomer itself was colloidally dispersed in water. Since the dispersion property in water is decreased when the conductive polymer copolymer was prepared, the filtering capability was decreased.

Assessment of Thin Film Characteristic Based on AFM

Samples S-2 and ref-3 having the same EDOT content were selected among the compositions prepared in Example 2 and Comparative Example 2, and a thin film was fabricated by using sample ref-5 having the least content of the colloid-type ionomer. The thin film was fabricated by spin-coating the compositions of S-2, ref-3, and ref-5 on an ITO glass substrate at 2000 rpm for 30 seconds with a spin-coating machine, and baking the resulting substrate at 120° C. for about 15 minutes. The quality of the thin film was assessed by taking AFM photographs with a Park AFM (atomic force microscopy) system XE-100 (product model name). The results are presented in FIGS. 2 to 4. In addition, surface roughness Ra and Rq were measured and the results are presented in Table 3.

TABLE 3

| Example 2 S-2 | Comparative Example 2 ref-3 | Comparative Example 2 ref-5 |
|---|---|---|
| Ra = 0.75 nm | Ra = 5.46 nm | Ra = 1.80 nm |
| Rq = 0.95 nm | Rq = 6.94 nm | Rq = 3.60 nm |

Figure 2:
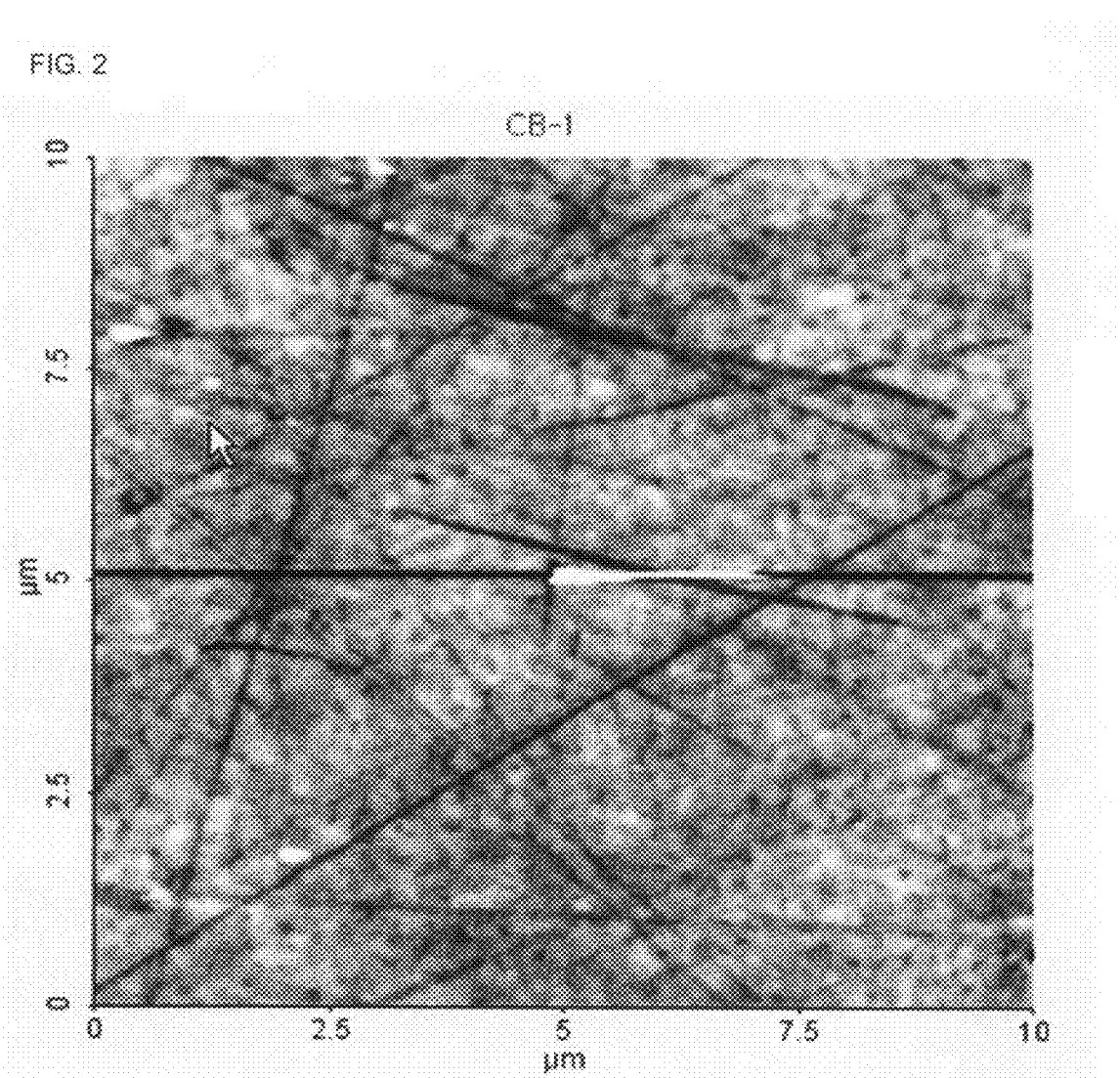
FIG. 2 to FIG. 4 respectively illustrate AFM measurement results of the organic layers fabricated using the polymer compound compositions according to Example 2 and Comparative Example 1.
Figure 3:
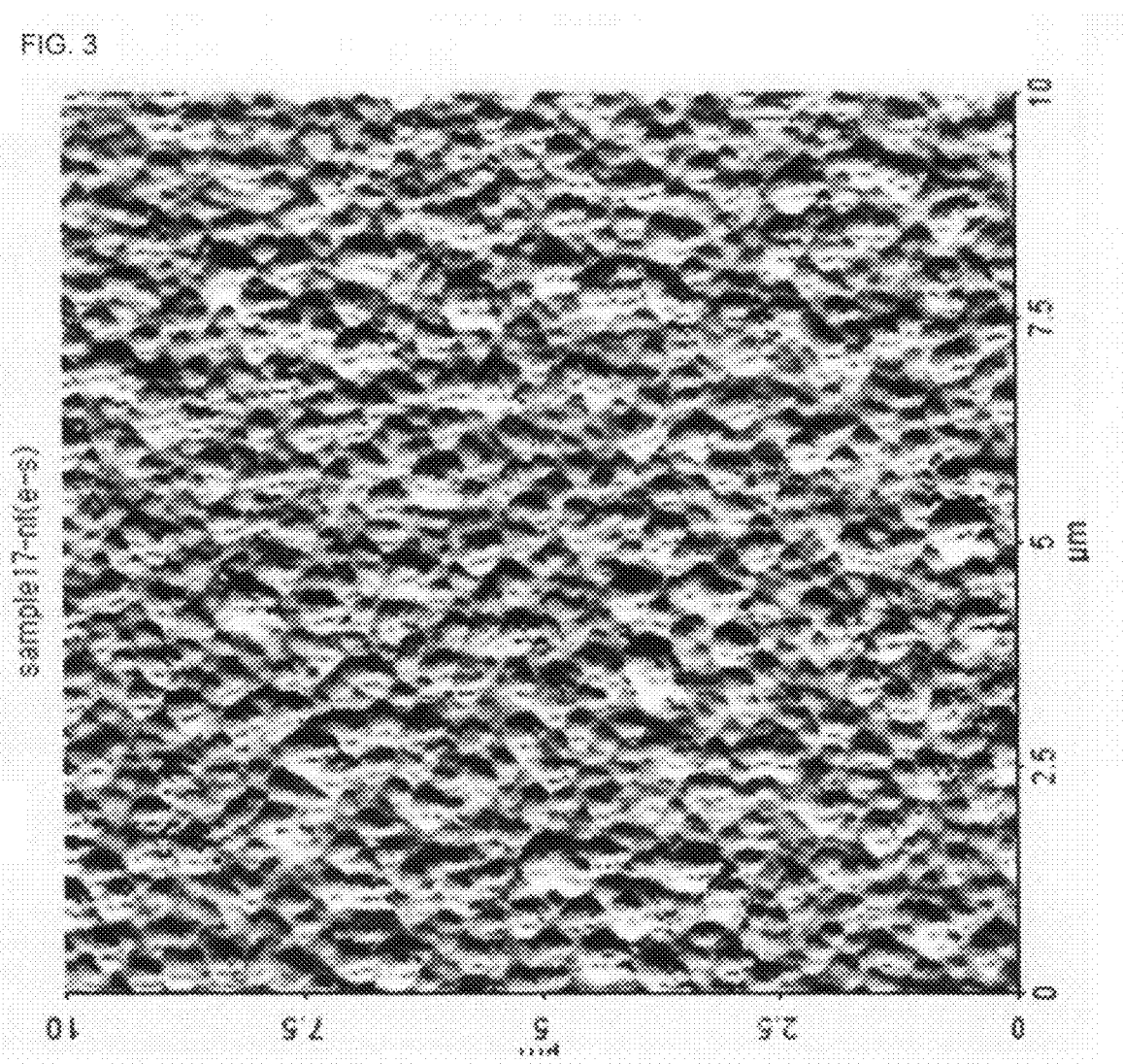
Figure 4:
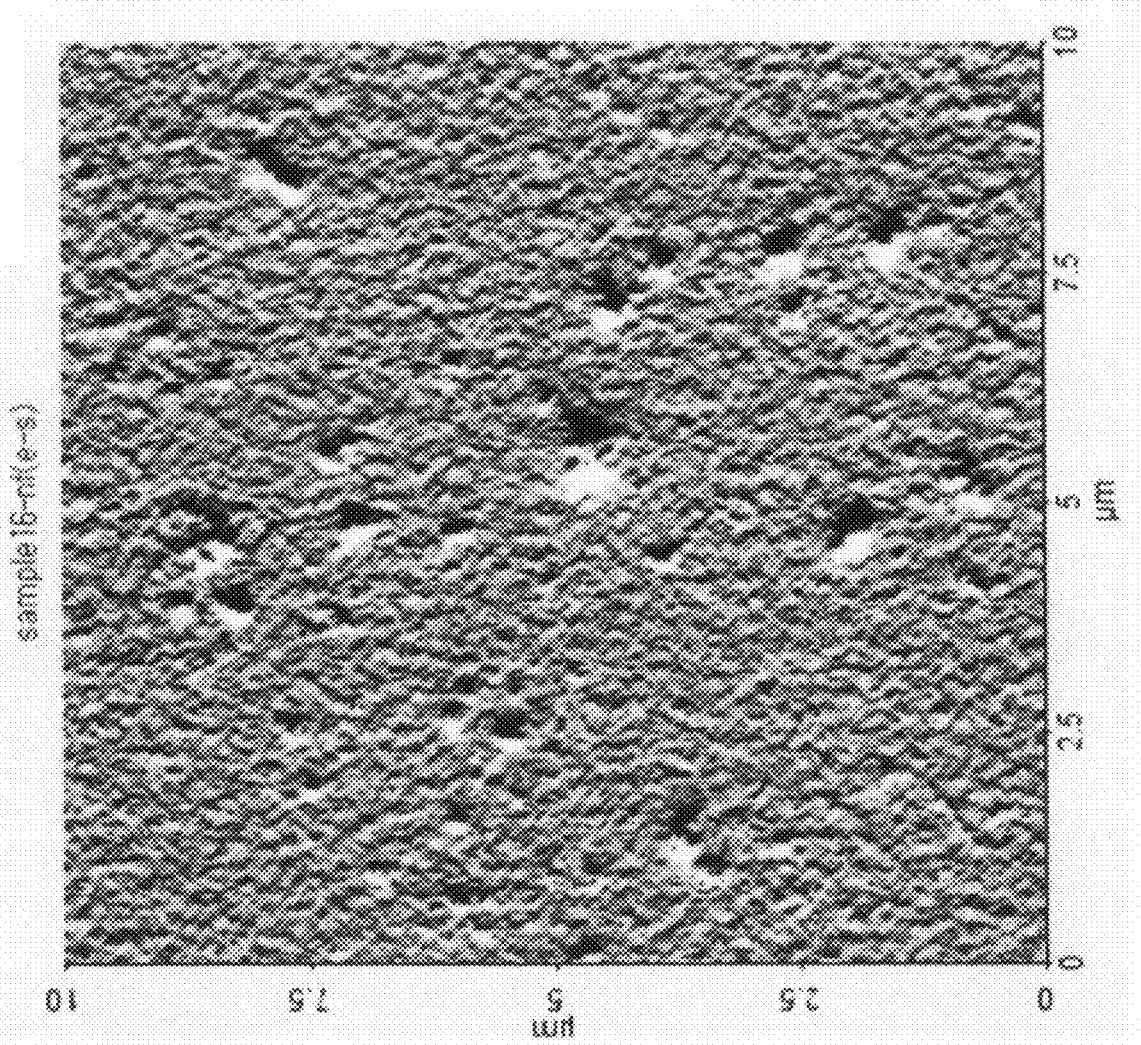

As shown in FIG. 2 to FIG. 4 and Table 3, sample S-2 had the best thin film characteristic as a result of the AFM measurement. On the other hand, reference samples ref-3 and ref-5 using only an ionomer or simple blending had inferior thin film planarity to the sample S-2, because the colloid-type ionomers agglomerated during the fabrication of the thin film, as confirmed by the AFM image.

Example 3

Fabrication of Organic Light Emitting Diode

A 15 Ψ/cm$^2$ 1200 Å ITO glass substrate from the Corning Company was cut in a size of width×length×thickness of 50 mm×50 mm×0.7 mm, rinsed using ultrasonic waves in isopropyl alcohol and deionized water for 5 minutes, and cleaned with ultraviolet rays and ozone for 30 minutes. The above-prepared substrate was spin-coated with the conductive polymer compound compositions of samples S-2, S-5, and S-8 prepared in Example 2 to thereby form a 70 nm-thick hole injection layer (HIL). A 700 nm-thick light emission layer was formed of a green light emitting polymer in the upper part of the hole injection unit, and a second electrode of LiF at 2 nm and Al at 100 nm was formed on the light emission layer to thereby fabricate an organic light emitting diode. The prepared device samples were marked as D-1, D-2, and D-3, and are presented as in the following Table 4.

TABLE 4

| Device | Conductive polymer compound | Example Nos. | Compound of Chemical Formula 26 (wt %) | NAFION (wt %) | EDOT (wt %) |
|---|---|---|---|---|---|
| D-1 | S-2 | Example 2 | 43 | 43 | 14 |
| D-2 | S-5 | Example 2 | 68.8 | 17.2 | 14 |
| D-3 | S-8 | Example 2 | 77.4 | 8.6 | 14 |

Comparative Example 3

An organic light emitting diode was fabricated according to the same method as Example 5, except that a Baytron-P 4083 PEDOT/PSS aqueous solution of the Bayer Company was used as a material for forming a hole injection layer (HIL). This was named sample Ref-D.

<Comparison of Device Characteristics>

Luminous efficiency of the device samples prepared according to Example 3 and Comparative Example 3 was measured using a SpectraScan PR650 spectroradiometer. The results are presented in the following Table 5, FIG. 5 (efficiency characteristic), and FIG. 6 (power characteristic. Table 5 presents a relative assessment based on the ref-D. In other words, values were given by assuming the value of the ref-D to be 100%.

TABLE 5

| | Device measurement result | | | | | | Relative evaluation | | | | | |
|---|---|---|---|---|---|---|---|---|---|---|---|---|
| | Voltage and efficiency (1000 nit reference) | | | $V_{on}$ | Max. efficiency (max) | | Voltage and efficiency (1000 nit reference) | | | $V_{on}$ (V) | Max. efficiency (max) | |
| Sample | Vd (V) | cd/A | lm/W | (V) | cd/A | lm/W | Vd (V) | cd/A | lm/W | | cd/A | lm/W |
| ref-D | 6.2 | 7.7 | 3.9 | 2.4 | 9.9 | 4.0 | 100% | 100% | 100% | 100% | 100% | 100% |
| D-1 | 6.2 | 8.2 | 4.2 | 2.4 | 10.2 | 4.2 | 100% | 106% | 106% | 100% | 103% | 105% |
| D-2 | 5.0 | 8.8 | 5.5 | 2.4 | 9.5 | 8.6 | 119% | 113% | 140% | 100% | 95% | 216% |
| D-3 | 4.8 | 13.1 | 8.6 | 2.4 | 14.5 | 15.1 | 123% | 169% | 219% | 100% | 146% | 381% |

Figure 5:
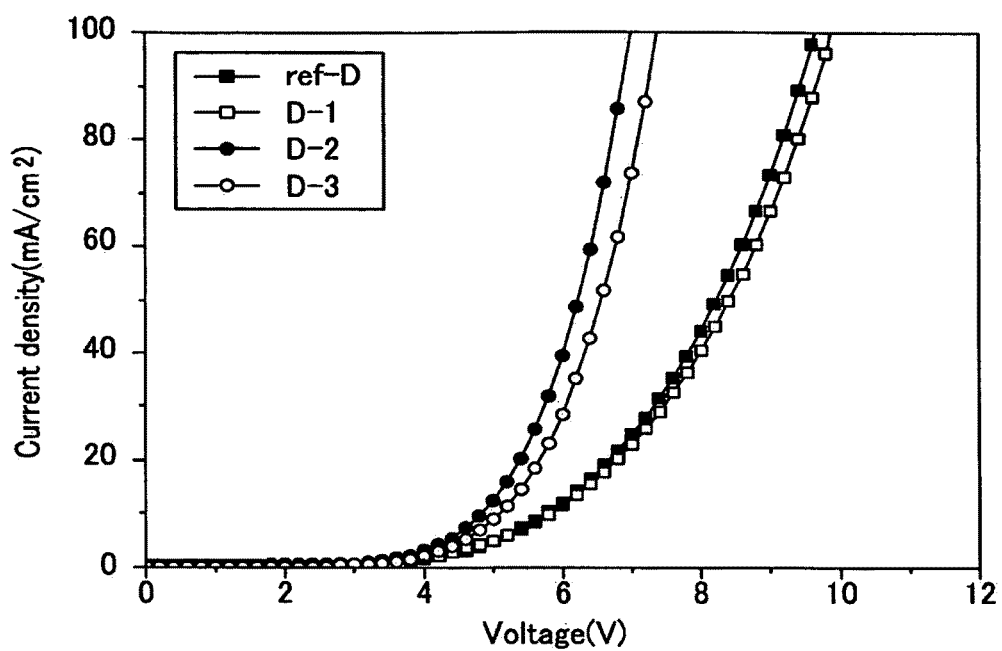
FIG. 5 illustrates a graph showing efficiency characteristics of the organic light emitting diode according to Example 3 and Comparative Example 3.
Figure 6:
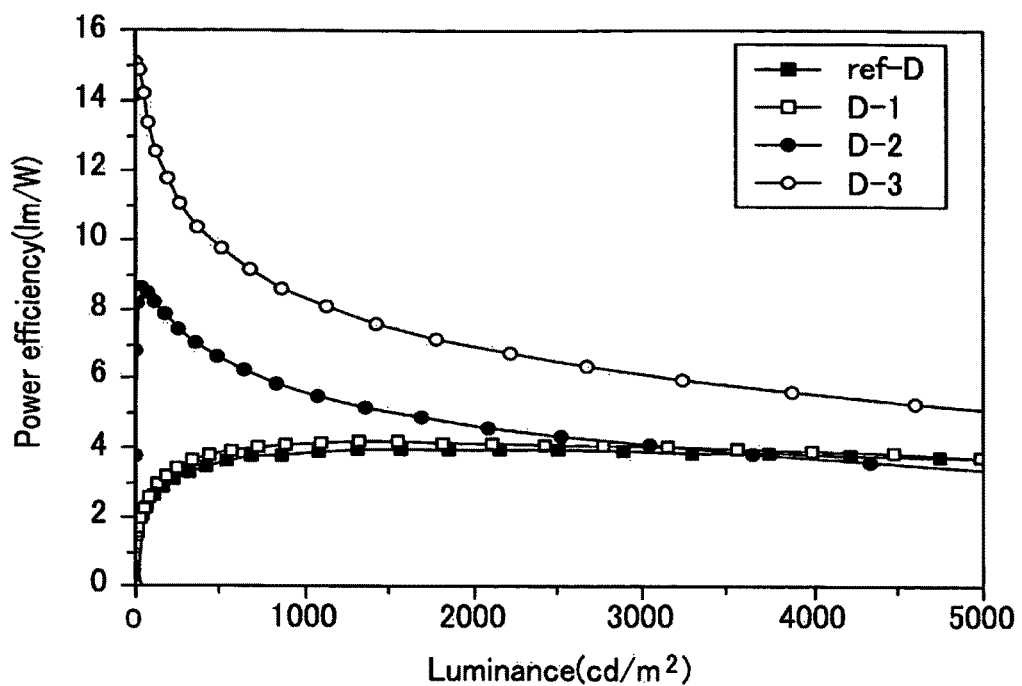
FIG. 6 illustrates a graph showing power characteristics of the organic light emitting diodes according to Example 3 and Comparative Example 3.

Table 4 and FIGS. 5 and 6 show that device sample D-3 had the best efficiency among the examples. The current efficiency of device sample D-3 was about 10.9 cd/A, which is 69% higher than reference sample Ref-D, i.e., 7.7 cd/A. Also, it showed an improvement of about 220% in electrical power efficiency.

Table 4 also reveals that other samples except for D-3 had improved efficiency compared to Ref-D. Consequently, it can be seen that the organic light emitting diode according to an embodiment using the conductive polymer copolymer composition as a hole injection layer (HIL) has excellent luminous efficiency.

As described above, embodiments relate to a conductive polymer compound that may provide excellent thin film characteristics and storage stability, and may be capable of improving luminous efficiency and life-span characteristics of an organic photoelectric device, and an organic photoelectric device including the same. In an embodiment, the conductive polymer compound includes a conductive polymer, and repeating units by of the specific Chemical Formulae.

As described above, the conductive polymer compound according to an embodiment may suppress moisture absorption. Further, acidity may be decreased by the water-soluble polymer, i.e., the conductive polymer compound according to an embodiment may decrease acidity in the presence of a water-soluble polymer. Thus, it may be possible to prevent a problem that may be caused by high acidity in an organic photoelectric device. Also, the conductive polymer compound according to an embodiment may reduce agglomeration among molecules when a water-soluble polymer is mixed with a colloid-type polymer. Thus, it may be possible to prepare a conductive polymer compound composition with excellent thin film characteristics and storage stability. Therefore, the conductive polymer compound according to an embodiment may improve the luminous efficiency and life-span characteristics of an organic light emitting diode that is fabricated therewith.

Embodiments are not limited to the those illustrated in the drawings and set forth in tables, but can be fabricated with various modifications and equivalent arrangements. Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A conductive polymer compound, comprising:

a conductive polymer; and a mixture of:

a copolymer including a first repeating unit represented by the following Chemical Formula 1 and a second repeating unit represented by the following Chemical Formula 2; and a compound including a third repeating unit represented by the following Chemical Formula 3 and/or Chemical Formula 4,

[Chemical Formula 1]

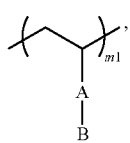

-continued

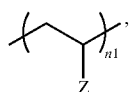
[Chemical Formula 2]

wherein, in the above Chemical Formulae 1 and 2:
$0.0001 \leq n1/m1 \leq 1$, m1 being the number of moles of Chemical Formula 1 and n1 being the number of moles of Chemical Formula 2, A is a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; or a substituted or unsubstituted heteroarylester, B is an ion pair of a cation and an anion, where:
the cation is:
$H^+$;
a metal ion, the metal ion being $Na^+$, $K^+$, $Li^+$, $Mg^{2+}$, $Zn^{2+}$, or $Al^{3+}$;
$NR_4^+$, where R is H or a substituted or unsubstituted alkyl; or
an organic ion of $CH_3(-CH_2-)pO^+$, where p ranges from 1 to 50; and the anion is $PO_3^{2-}$, $SO_3^-$, $COO^-$, $I^-$, or $CH_3COO^-$, and Z is a halogen-containing substituted or unsubstituted hydrocarbon,

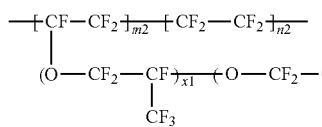
[Chemical Formula 3]

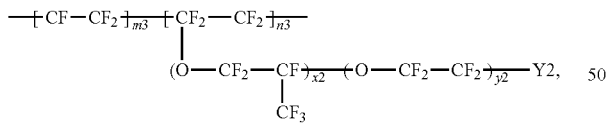
[Chemical Formula 4]

wherein, in the above Chemical Formulae 3 and 4:
$0 < m2 \leq 10,000,000$, $0 \leq n2 < 10,000,000$,
$0 < m3 \leq 10,000,000$, $0 \leq n3 < 10,000,000$,
x1, x2, y1, and y2 are independently integers ranging from 0 to 20, and
Y1 and Y2 are independently:
—$COO^-M^+$;
—$SO_3M^+$; or
—$PO_3^{2-}(M^+)_2$, where $M^+$ is $Na^+$, $K^+$, $Li^+$, $H^+$, or $NH_4^+$.

2. The conductive polymer compound as claimed in claim 1, wherein A is a substituted or unsubstituted C1 to C30 alkyl; a substituted or unsubstituted C1 to C30 heteroalkyl; a substituted or unsubstituted C1 to C30 alkoxy; a substituted or unsubstituted C1 to C30 heteroalkoxy; a substituted or unsubstituted C6 to C30 aryl; a substituted or unsubstituted C6 to C30 arylalkyl; a substituted or unsubstituted C6 to C30 aryloxy; a substituted or unsubstituted C2 to C30 heteroaryl; a substituted or unsubstituted C2 to C30 heteroarylalkyl; a substituted or unsubstituted C2 to C30 heteroaryloxy; a substituted or unsubstituted C5 to C20 cycloalkyl; a substituted or unsubstituted C2 to C30 heterocycloalkyl; a substituted or unsubstituted C2 to C30 alkylester; a substituted or unsubstituted C1 to C30 heteroalkylester; a substituted or unsubstituted C7 to C30 arylester; or a substituted or unsubstituted C2 to C30 heteroarylester.

3. The conductive polymer compound as claimed in claim 1, wherein the conductive polymer includes: polyphenylene; polyphenylenevinylene; a repeating unit derived from aniline or derivatives thereof represented by the following Chemical Formula 5; a repeating unit derived from pyrrole, thiophene, or derivatives thereof represented by the following Chemical Formula 6; cyclic repeating unit represented by the following Chemical Formula 7; or a combination thereof,

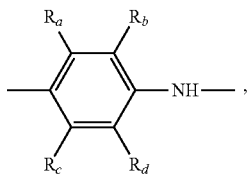
[Chemical Formula 5]

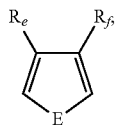
[Chemical Formula 6]

wherein, in the above Chemical Formulae 5 and 6:
E is:
NR, where R is H or a C1 to C7 lower alkyl; or
S,
$R_a$, $R_b$, $R_c$, and $R_d$ are independently hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted arylamine; a substituted or unsubstituted pyrrole; a substituted or unsubstituted C6 to C30 thiophene; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; or a substituted or unsubstituted heteroarylester, and $R_e$ and $R_f$ are independently:
NR, where R is H or a C1 to C7 lower alkyl;
a C1 to C20 alkyl including a heteroatom, the heteroatom being N, O, S, or P;
a C6 to C20 aryl including a heteroatom, the heteroatom being N, O, S, or P;
an alkyl;
an aryl;
an alkoxy;

a C1 to C30 heteroalkyl;
a heteroalkoxy;
an arylalkyl;
an aryloxy;
a C6 to C30 arylamine;
a C6 to C30 pyrrole;
a C6 to C30 thiophene;
a heteroaryl;
a heteroarylalkyl;
a heteroaryloxy;
a C5 to C20 cycloalkyl;
a heterocycloalkyl;
an alkylester;
a heteroalkylester;
an arylester; or
a heteroarylester,

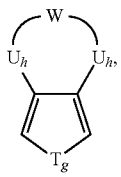 [Chemical Formula 7]

wherein, in the above Chemical Formula 7:
  T is:
    NR, where R is H or a C1 to C7 lower alkyl;
    a heteroatom, the heteroatom being O or S; or
    PR, where R is a C1 to C20 alkyl or a C6 to C20 aryl,
  U is:
    NR, where R is H or a C1 to C7 lower alkyl;
    a heteroatom, the heteroatom being O or S; or
    PR, where R is a C1 to C20 alkyl or a C6 to C20 aryl,
  g and h are independently 0 to 9,
  W is —$(CH_2)_x$—$CR_gR_h$—$(CH_2)_y$, where:
    $R_g$ and $R_h$ are independently:
      H;
      a C1 to C20 alkyl radical;
      a C6 to C14 aryl radical; or
      —$CH_2$—$OR_i$, where $R_i$ is H, a C1 to C6 alkyl acid, a C1 to C6 alkylester, a C1 to C6 heteroalkyl acid, or a C1 to C6 alkylsulfonic acid, and
  x and y are independently 0 to 5.

4. A conductive polymer compound composition, comprising:
  a conductive polymer compound, the conductive polymer compound including:
    a conductive polymer, and
    a mixture of:
      a copolymer including a first repeating unit represented by the following Chemical Formula 1 and a second repeating unit represented by the following Chemical Formula 2, and
      a compound including a third repeating unit represented by the following Chemical Formula 3 and/or Chemical Formula 4; and
  a solvent,

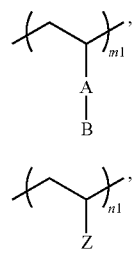 [Chemical Formula 1]

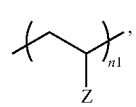 [Chemical Formula 2]

wherein, in the above Chemical Formulae 1 and 2:
  $0.0001 \le n1/m1 \le 1$, m1 being the number of moles of Chemical Formula 1, and n1 being the number of moles of Chemical Formula 2;
  A is a substituted or unsubstituted alkyl, a substituted or unsubstituted heteroalkyl, a substituted or unsubstituted alkoxy, a substituted or unsubstituted heteroalkoxy, a substituted or unsubstituted aryl, a substituted or unsubstituted arylalkyl, a substituted or unsubstituted aryloxy, a substituted or unsubstituted heteroaryl, a substituted or unsubstituted heteroarylalkyl, a substituted or unsubstituted heteroaryloxy, a substituted or unsubstituted cycloalkyl, a substituted or unsubstituted heterocycloalkyl, a substituted or unsubstituted alkylester, a substituted or unsubstituted heteroalkylester, a substituted or unsubstituted arylester, or a substituted or unsubstituted heteroarylester;
  B is an ion pair of a cation and an anion, where:
    the cation is:
      $H^+$;
      a metal ion, the metal ion being $Na^+$, $K^+$, $Li^+$, $Mg^{2+}$, $Zn^{2+}$, or $Al^{3+}$;
      $NR_4^+$, where R is H or a substituted or unsubstituted alkyl; or
      an organic ion of $CH_3(—CH_2—)_pO^+$, where p ranges from 1 to 50; and
    the anion is: $PO_3^{2-}$, $SO_3^-$, $COO^-$, $I^-$, or $CH_3COO^-$, and
  Z is a halogen-containing substituted or unsubstituted hydrocarbon,

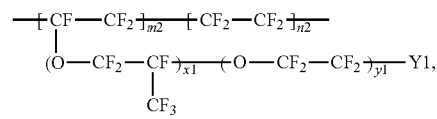 [Chemical Formula 3]

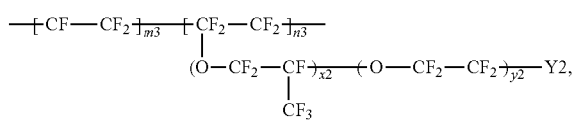 [Chemical Formula 4]

wherein, in the above Chemical Formulae 3 and 4:
  $0 < m2 \le 10{,}000{,}000$, $0 \le n2 < 10{,}000{,}000$,
  $0 < m3 \le 10{,}000{,}000$, $0 \le n3 < 10{,}000{,}000$,
  x1, x2, y1, and y2 are independently integers ranging from 0 to 20, and
  Y1 and Y2 are independently:
    —$COO^-M^+$;
    —$SO_3M^+$; or —$PO_3^{2-}(M^+)_2$, where $M^+$ is $Na^+$, $K^+$, $Li^+$, $H^+$, or $NH_4^+$.

5. The conductive polymer compound composition as claimed in claim 4, wherein the conductive polymer includes: polyphenylene; polyphenylenevinylene; a repeating unit derived from aniline or derivatives thereof represented by the following Chemical Formula 5; a repeating unit derived from pyrrole, thiophene, or derivatives thereof represented by the following Chemical Formula 6; a cyclic repeating unit represented by the following Chemical Formula 7; or a combination thereof,

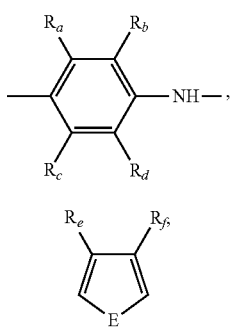

[Chemical Formula 5]

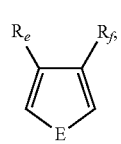

[Chemical Formula 6]

wherein, in the above Chemical Formulae 5 and 6:
E is:
  NR, where R is H or a C1 to C7 lower alkyl; or
  S,
$R_a$, $R_b$, $R_c$, and $R_d$ are independently hydrogen; a substituted or unsubstituted alkyl; a substituted or unsubstituted heteroalkyl; a substituted or unsubstituted alkoxy; a substituted or unsubstituted heteroalkoxy; a substituted or unsubstituted aryl; a substituted or unsubstituted arylalkyl; a substituted or unsubstituted aryloxy; a substituted or unsubstituted arylamine; a substituted or unsubstituted pyrrole; a substituted or unsubstituted C6 to C30 thiophene; a substituted or unsubstituted heteroaryl; a substituted or unsubstituted heteroarylalkyl; a substituted or unsubstituted heteroaryloxy; a substituted or unsubstituted cycloalkyl; a substituted or unsubstituted heterocycloalkyl; a substituted or unsubstituted alkylester; a substituted or unsubstituted heteroalkylester; a substituted or unsubstituted arylester; or a substituted or unsubstituted heteroarylester, and
$R_e$ and $R_f$ are independently:
  NR, where R is H or a C1 to C7 lower alkyl;
  a C1 to C20 alkyl including a heteroatom, the heteroatom being N, O, S, or P;
  a C6 to C20 aryl including a heteroatom, the heteroatom being N, O, S, or P;
  an alkyl;
  an aryl;
  an alkoxy;
  a C1 to C30 heteroalkyl;
  a heteroalkoxy;
  an arylalkyl;
  an aryloxy;
  a C6 to C30 arylamine;
  a C6 to C30 pyrrole;
  a C6 to C30 thiophene;
  a heteroaryl;
  a heteroarylalkyl;
  a heteroaryloxy;
  a C5 to C20 cycloalkyl;
  a heterocycloalkyl;
  an alkylester;
  a heteroalkylester;
  an arylester; or
  a heteroarylester,

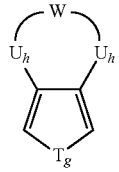

[Chemical Formula 7]

wherein, in the above Chemical Formula 7:
T is:
  NR, where R is H or a C1 to C7 lower alkyl;
  a heteroatom, the heteroatom being O or S; or
  PR, where R is a C1 to C20 alkyl or a C6 to C20 aryl,
U is:
  NR, where R is H or a C1 to C7 lower alkyl;
  a heteroatom, the heteroatom being O or S; or
  PR, where R is a C1 to C20 alkyl or a C6 to C20 aryl,
g and h are independently 0 to 9,
W is:
  —$(CH_2)_x$—$CR_gR_h$—$(CH_2)y$, where Rg and Rh are independently:
    H;
    a C1 to C20 alkyl radical;
    a C6 to C14 aryl radical; or
    —$CH_2$—$OR_i$, where $R_i$ is H, a C1 to C6 alkyl acid, a C1 to C6 alkylester, a C1 to C6 heteroalkyl acid, or a C1 to C6 alkylsulfonic acid, and
x and y are independently 0 to 5.

6. The conductive polymer compound composition as claimed in claim 4, further comprising: a physical cross-linking agent; a chemical cross-linking agent; or a combination thereof.

7. The conductive polymer compound composition as claimed in claim 6, wherein the conductive polymer compound composition includes the physical cross-linking agent in an amount of about 0.001 to about 5 parts by weight based on 100 parts by weight of the conductive polymer.

8. The conductive polymer compound composition as claimed in claim 7, wherein the physical cross-linking agent includes: glycerol; butanol; polyvinylalcohol; polyethyleneglycol; polyethyleneimine; polyvinylpyrrolidone; or a combination thereof.

9. The conductive polymer compound composition as claimed in claim 6, wherein the conductive polymer compound composition includes the chemical cross-linking agent in an amount of about 0.001 to about 50 parts by weight based on 100 parts by weight of the conductive polymer.

10. The conductive polymer compound composition as claimed in claim 9, wherein the chemical cross-linking agent includes: tetraethyloxysilane; polyaziridine; a melamine-based polymer; an epoxy-based polymer; or a combination thereof.

11. The conductive polymer compound composition as claimed in claim 4, wherein the solvent includes: water; alcohol; dimethyl formamide; dimethylsulfoxide; toluene; xylene; chlorobenzene; or a combination thereof.

12. A conductive polymer organic layer, the conductive polymer organic layer being made using the conductive polymer composition according to claim 4.

13. An organic photoelectric device, comprising a conductive polymer organic layer made using the conductive polymer composition according to claim 4.

14. The organic photoelectric device as claimed in claim 13, wherein the organic photoelectric device is an organic light emitting diode.

15. The organic photoelectric device as claimed in claim 13, wherein the conductive polymer organic layer is a hole injection layer or an electron injection layer.

* * * * *